(12) United States Patent
Song

(10) Patent No.: US 12,508,528 B2
(45) Date of Patent: Dec. 30, 2025

(54) COVER ASSEMBLY AND POWER CONVERSION DEVICE COMPRISING SAME

(71) Applicant: LS ELECTRIC CO., LTD., Anyang-si (KR)

(72) Inventor: Bo Sun Song, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 365 days.

(21) Appl. No.: 18/039,470

(22) PCT Filed: Nov. 24, 2021

(86) PCT No.: PCT/KR2021/017361
§ 371 (c)(1),
(2) Date: May 30, 2023

(87) PCT Pub. No.: WO2022/114763
PCT Pub. Date: Jun. 2, 2022

(65) Prior Publication Data
US 2024/0001272 A1    Jan. 4, 2024

(30) Foreign Application Priority Data
Nov. 30, 2020    (KR) .................. 10-2020-0164860

(51) Int. Cl.
*B01D 46/00*    (2022.01)
*H02M 7/00*    (2006.01)
*H05K 7/20*    (2006.01)

(52) U.S. Cl.
CPC ..... *B01D 46/0005* (2013.01); *B01D 46/0004* (2013.01); *H02M 7/003* (2013.01);
(Continued)

(58) Field of Classification Search
CPC ............ H05K 7/20181; H05K 7/2089; H05K 7/20909; H05K 5/0213; H05K 5/03;
(Continued)

(56) References Cited

U.S. PATENT DOCUMENTS 4,743,281 A * 5/1988 Kennedy ................ B01D 46/10
                                                            55/504
4,751,872 A * 6/1988 Lawson, Jr. ....... H05K 7/20181
                                                            361/695
(Continued)

FOREIGN PATENT DOCUMENTS

CN    106237747 A * 12/2016 ............. B01D 46/10
CN    109068520 A * 12/2018 ........... H05K 5/0213
(Continued)

OTHER PUBLICATIONS

International Search Report for related International Application No. PCT/KR2021/017361; action dated Jun. 2, 2022; (5 pages).
(Continued)

*Primary Examiner* — Andrew Roersma
(74) *Attorney, Agent, or Firm* — K&L Gates LLP

(57) ABSTRACT

A cover assembly and a power conversion device comprising the same are disclosed. The cover assembly according to an embodiment of the present disclosure is detachably coupled to an inverter device. The cover assembly communicates with the inside of the inverter device, and is coupled to the inverter device while covering a blower fan. Therefore, the blower fan is not exposed to the outside, and thus the blower fan can be prevented from being arbitrarily damaged, and introduction of dust and the like residing outside the inverter device into the inverter device can be prevented.

15 Claims, 24 Drawing Sheets

(52) U.S. Cl.
CPC ..... *H05K 7/20181* (2013.01); *H05K 7/20909* (2013.01); *B01D 2265/027* (2013.01); *B01D 2265/06* (2013.01); *B01D 2279/45* (2013.01)

(58) Field of Classification Search
CPC ............ B01D 46/0005; B01D 46/0004; B01D 46/001; B01D 2265/027; B01D 2265/06; B01D 2279/45
See application file for complete search history.

(56) References Cited

U.S. PATENT DOCUMENTS

| | | | | |
|---|---|---|---|---|
| 5,514,036 | A | * | 5/1996 | Lin .................... G11B 33/1446 55/471 |
| 5,673,029 | A | * | 9/1997 | Behl .................... G11B 33/142 |
| 5,935,282 | A | * | 8/1999 | Lin ........................ B01D 46/10 55/501 |
| 6,319,116 | B1 | * | 11/2001 | Behl .................. H05K 7/20581 |
| 6,604,799 | B2 | * | 8/2003 | Searby ..................... G06F 1/20 312/265.5 |
| 6,776,706 | B2 | * | 8/2004 | Kipka ................ H05K 7/20181 55/467 |
| 8,974,585 | B2 | * | 3/2015 | Hartmann .......... B01D 46/4254 96/417 |
| 11,395,437 | B2 | * | 7/2022 | Quijano ............. H05K 7/20181 |
| 12,369,262 | B2 | * | 7/2025 | Hano .................... H05K 5/0214 |
| 2005/0088817 | A1 | * | 4/2005 | Ou Yang ................ G06F 1/20 361/695 |
| 2008/0016834 | A1 | * | 1/2008 | Lee ........................ B01D 46/10 55/385.6 |
| 2008/0121107 | A1 | * | 5/2008 | Pfannenberg ...... B01D 46/0005 96/417 |
| 2011/0132198 | A1 | * | 6/2011 | Gallo ..................... B01D 46/62 55/484 |
| 2013/0067875 | A1 | * | 3/2013 | Hartmann ............. B01D 46/10 55/428 |
| 2020/0037837 | A1 | * | 2/2020 | Hsieh .................... A47L 7/0047 |
| 2020/0164297 | A1 | * | 5/2020 | Liao .................. B01D 46/0005 |
| 2020/0269175 | A1 | * | 8/2020 | Yang ..................... B01D 46/10 |
| 2020/0398205 | A1 | * | 12/2020 | Hiranuma ......... H01M 8/04044 |
| 2023/0318476 | A1 | * | 10/2023 | Jeon .................. H05K 7/20909 361/807 |

FOREIGN PATENT DOCUMENTS

| | | | |
|---|---|---|---|
| CN | 210924676 U | | 7/2020 |
| CN | 211063536 U | * | 7/2020 |
| EP | 1947547 A1 | * | 7/2008 ............. B01D 46/88 |
| JP | 2790484 B2 | | 8/1998 |
| JP | 2005243741 A | | 9/2005 |
| JP | 4285270 B2 | * | 6/2009 |
| KR | 1020140054928 A | * | 5/2014 ............... H05K 5/03 |
| KR | 1020180070757 A | * | 6/2018 ............. B01D 46/00 |
| KR | 102092103 B1 | | 3/2020 |

OTHER PUBLICATIONS

Written Opinion for related International Application No. PCT/KR2021/017361; action dated Jun. 2, 2022; (4 pages).

* cited by examiner (a)          (b)

(a)  (b)

COVER ASSEMBLY AND POWER CONVERSION DEVICE COMPRISING SAME

CROSS-REFERENCE TO RELATED APPLICATION

This application is a National Stage of International Application No. PCT/KR2021/017361, filed on Nov. 24, 2021, which claims priority to and the benefit of Korean Patent Application No. 10-2020-0164860, filed on Nov. 30, 2020, the disclosure of which is incorporated herein by reference in its entirety.

FIELD

The present disclosure relates to a cover assembly and a power conversion device including the same, and more specifically, to a cover assembly having a structure in which an energized part is not arbitrarily exposed to the outside and dust or the like can be prevented from entering, and a power conversion device including the same.

BACKGROUND

A power conversion device generally receives DC power, converts it to AC power, and outputs it. This is due to the fact that power used for home and industrial purposes is mainly AC power.

In this case, the capacity that the power conversion device can convert at one time or the capacity of AC power that can be stored at one time may be named "power conversion capacity".

The power conversion device may be provided and used in an energy storage system (ESS). The power conversion capacity of the power conversion device is an important factor in determining the capacity of the ESS equipped with the corresponding power conversion device.

Components of a power conversion device include an inverter and a filter. The inverter performs a function of converting input DC power into AC power. The filter performs filtering to remove noise of the AC power converted by the inverter.

An inverter constituting a power conversion device includes various components. As the inverter operates, the components generate large amounts of heat. If the generated heat stays inside the inverter, there is a risk that the components may be damaged by the generated heat.

Therefore, heat dissipation is an important factor in the operation of inverters. To this end, it is common that a fan is provided in the inverter.

Meanwhile, it is common that the fan provided in the inverter according to the related art is installed to be exposed to the outside. This is to directly discharge the heat generated inside the inverter into the atmosphere.

However, as the fan is exposed to the outside, it may be damaged by the environment in which the power conversion device is installed. In addition, the possibility that dust or the like present in the external environment may flow into the inverter through the fan according to the flow of air cannot be ruled out.

Korean Patent Registration No. 10-1699214 discloses a power conversion device and an air conditioner. Specifically, it discloses an example provided together with an air conditioner for discharging heat generated in the power conversion device to the outside.

However, the above prior art document only discloses a method for dissipating heat generated in the power conversion device using a fan, but does not clearly disclose the arrangement structure.

Korean Patent Registration No. 10-1652675 discloses a power conversion device. Specifically, it discloses a power conversion device having an outdoor fan for discharging heat generated in the power conversion device to the outside.

However, the above prior art document also only discloses a method for dissipating heat generated in a power conversion device using a fan, but does not suggest an arrangement structure the fan and a method for preventing exposure of the fan.

Furthermore, the fan provided in the prior art documents is provided outside the power conversion device. The above prior art documents do not suggest a method for preventing the inflow of dust and the like while providing a fan inside the power conversion device.

Korean Patent Registration No. 10-1699214 (2017.10.23.)

Korean Patent Registration No. 10-1652675 (2016.08.30.)

SUMMARY

The present disclosure is directed to providing a cover assembly having a structure capable of solving the above problems and a power conversion device including the same.

First, the present disclosure is directed to providing a cover assembly having a structure in which components for converting power are not exposed to the outside, and a power conversion device including the same.

In addition, the present disclosure is directed to providing a cover assembly having a structure in which coupling and separation of each component can be easily performed, and a power conversion device including the same.

In addition, the present disclosure is directed to providing a cover assembly having a structure in which the coupled state of each component can be stably maintained, and a power conversion device including the same.

In addition, the present disclosure is directed to providing a cover assembly having a structure capable of effectively separating dust and the like contained in air introduced in order to dissipate heat of a component for converting power, and a power conversion device including the same.

In addition, the present disclosure is directed to providing a cover assembly having a structure capable of securing a beautiful appearance and a power conversion device including the same.

In order to achieve the above objects, the present disclosure provides a cover assembly, comprising: a main cover with a space formed therein; a filter cover that covers the space of the main cover and is detachably coupled to the main cover; and a filter member detachably coupled to the filter cover and accommodated in the space of the main cover, wherein the main cover comprises: an accommodation space part formed through and communicating with the outside and forming the space; and a main body partially surrounding the accommodation space part, and the filter cover accommodated in the accommodation space part is supported by the main body.

In addition, the cover assembly may include a sub cover that is detachably coupled to the main cover and extends in one direction, the main cover may have coupling protrusions located on each part of the main body surrounding each end of the sub cover in the one direction, and protruding toward the sub cover, and the sub cover may include a sub coupling part detachably coupled to the coupling protrusion.

In addition, the sub coupling part of the cover assembly may include a sub protrusion that protrudes toward said each part of the main body and is in contact with or spaced apart from the coupling protrusion; and a pressing protrusion that protrudes toward said each part of the main body and is spaced apart from the sub protrusion to form a space therebetween, and the coupling protrusion may be inserted into or drawn out of the space formed between the sub protrusion and the pressing protrusion.

In addition, the sub coupling part of the cover assembly may include an elastic part formed of a shape-deformable material that is continuous with the sub protrusion and the pressing protrusion respectively.

In addition, the pressing protrusion of the cover assembly may be located farther from the main body than the sub protrusion.

In addition, the sub cover of the cover assembly may be moved in the other direction and coupled to the main cover, and when the pressing protrusion is pressed in a direction opposite to the coupling protrusion, the coupling protrusion and the sub protrusion may be positioned to overlap each other along the other direction.

In addition, the main cover of the cover assembly may include a fastening part provided to be movable in a direction toward the filter cover and in a direction opposite to the filter cover, and the filter cover may include a fastening space part located on one side facing the fastening part and into or out of which the fastening part is accommodated or drawn.

In addition, the filter cover of the cover assembly may include a restraining protrusion part that surrounds the fastening space part and extends toward the fastening part, the restraining protrusion part may include any pair of surfaces disposed to face each other with the fastening space part interposed therebetween; and another pair of surfaces that are continuous with said any pair of surfaces and face each other with the fastening space part interposed therebetween, and the fastening part accommodated in the fastening space part may be supported by any one or more of said any pair of surfaces and said another pair of surfaces.

The fastening part of the cover assembly may include a handle part extending to be exposed to the outside of the main cover and coupled to the main body to be movable in a direction toward the filter cover and in a direction opposite to the filter cover; and a coupling extension part coupled to the handle part to be movable together with the handle part, extending toward the filter cover, and accommodated in or drawn out of the fastening space part.

In addition, the filter cover of the cover assembly may include a filter accommodating part accommodating the filter member and having one side facing the main cover open; and a filter cover body partially surrounding the filter accommodating part.

In addition, the filter cover of the cover assembly may include a grid part located on the other side opposite to the one side and including a plurality of through holes communicating with the outside of the filter accommodating part.

In addition, the filter cover of the cover assembly may include a filter support part positioned on the filter cover body partially surrounding the filter accommodating part to support the filter member accommodated therein, and the filter support part may include a plurality of surfaces extending toward the filter accommodating part and spaced apart from each other and disposed to face each other; and a space formed between the plurality of surfaces and into which the filter member is inserted.

In addition, the present disclosure provides a power conversion device, comprising: an inverter device electrically connected to an external power source and comprising a blower fan operated by the external power source; and a cover assembly that covers the blower fan and is detachably coupled to the inverter device, wherein the cover assembly comprises: a main cover accommodating the blower fan and comprising a communication part communicating with the outside; a filter cover detachably coupled to the main cover and covering the communication part; and a filter member accommodated in the filter cover and covering the communication part.

In addition, the main cover of the power conversion device may include an accommodation space part communicating with the outside and the communication part, formed on one side opposite to the inverter device, and accommodating the filter cover, and the filter cover may include a grid part positioned to face the communication part with the filter member interposed therebetween, and having a plurality of through holes and a plurality of ribs surrounding the through holes.

In addition, the power conversion device may further include a sub cover detachably coupled to the main cover, the main cover may include a main coupling part that communicates with the accommodation space part and is a space covered by the sub cover; and a coupling protrusion protruding toward the main coupling part from a surface surrounding the main coupling part, and the sub cover may include a sub coupling part comprising a space into or out of which the coupling protrusion is accommodated or drawn.

In addition, the sub coupling part of the power conversion device may include a sub protrusion protruding toward the surface and positioned closer to the main cover than the coupling protrusion in a state where the coupling protrusion is accommodated; a pressing protrusion protruding toward the surface and located to face the sub protrusion with the coupling protrusion interposed therebetween in a state where the coupling protrusion is accommodated; and an elastic part formed of a shape-deformable material that is continuous with the sub protrusion and the pressing protrusion.

In addition, when the pressing protrusion of the power conversion device is pressed toward the main coupling part, the sub protrusion may be moved in a direction opposite to the coupling protrusion and be spaced apart from the coupling protrusion.

In addition, the main cover of the power conversion device may include a fastening part provided to be movable in a direction toward the filter cover and in a direction opposite to the filter cover, and the filter cover may include a fastening space part located on one side facing the fastening part and into or out of which the fastening part is accommodated or drawn.

In addition, the fastening part of the power conversion device may include a handle part extending in a direction opposite to the inverter device, exposed to the outside of the main cover, and coupled to the main cover to be liftable or lowered; and a coupling extension part connected to the handle part to be lifted or lowered together with the handle part, and inserted into or drawn out of the fastening space part.

According to an embodiment of the present disclosure, the following effects can be achieved.

First, a cover assembly is provided in the power conversion device. The cover assembly is detachably mounted on the inverter device that is electrically connected to the outside. In this case, the cover assembly covers a blower fan provided in the inverter device and is coupled to the inverter device.

Therefore, among the components of the inverter device, components disposed outside the inverter device are not exposed to the outside. Accordingly, a safety accident that may occur as the blower fan or the like is operated can be prevented.

In addition, the cover assembly includes a main cover coupled to the inverter device, a sub cover coupled to the main cover, a filter cover, and a filter member. The sub cover and the main cover can be coupled by coupling the coupling protrusion and the sub coupling part. As an external force is applied to the sub coupling part, the sub cover can be coupled to or separated from the main cover.

The filter cover and the main cover are coupled by accommodating the filter cover in the accommodation space part. The main cover is provided with a fastening part capable of being lifted or lowered in a direction toward and opposite to the filter cover. When the fastening part is lowered, it is accommodated in the fastening space part of the filter cover. In the above state, the filter cover is not arbitrarily separated from the main cover. When the fastening part is lifted, the filter cover can be separated from the main cover by being drawn out of the fastening space part of the filter cover.

The filter member is accommodated in the filter accommodating part of the filter cover. The accommodated filter member is coupled to the filter support part and is not arbitrarily separated from the filter cover.

Therefore, with the above configuration, each component constituting the cover assembly can be easily coupled and separated from each other. In addition, since each component is not arbitrarily separated unless an external force is applied, the coupled state can be stably maintained.

In addition, the cover assembly covers a blower fan provided in the inverter device and is coupled to the inverter device. The blower fan makes the inside and outside of the inverter device to communicate to suck in outside air for cooling heat inside the inverter device. In this case, a filter member provided in the cover assembly is also disposed to cover the blower fan, so that outside air can be introduced into the inverter device through the blower fan only when the outside air passes through the filter member.

Therefore, outside air introduced to cool the heat of components provided in the inverter device is filtered by the filter member and then introduced into the inside of the inverter device. As a result, since purified air is introduced into the inverter device, damage to components of the inverter device due to dust or the like can be prevented.

In addition, as described above, the cover assembly is coupled to the inverter device while covering the same. In this case, components that rotate, such as a blower fan, and components provided for conducting electric current with the outside are covered by the cover assembly and are not exposed to the outside.

Accordingly, the components of the inverter device, particularly the rotating blower fan, are not exposed to the outside. Accordingly, safety accidents that may occur according to the operation of the inverter device can be prevented, and the entire appearance of the power conversion device can be more beautiful.

DETAILED DESCRIPTION

Hereinafter, a power conversion device 1 according to an embodiment of the present disclosure will be described in detail with reference to the accompanying drawings.

In the following description, in order to clarify the features of the present disclosure, descriptions of some components may be omitted.

1. Term Definition

The term "electrical connection" used in the following description means a state in which one or more members are connected to other members so as to enable electrical signal or current transmission. In an embodiment, the electrical connection may be formed in a wired manner by a conducting wire member or the like, or may be formed in a wireless manner by a magnetic field or an electric field.

The terms "front side", "rear side", "upper side", "lower side", "left side" and "right side" used in the following description will be understood with reference to the coordinate systems shown in FIGS. 1, 3, 10, 12 and 20.

Figure 1:
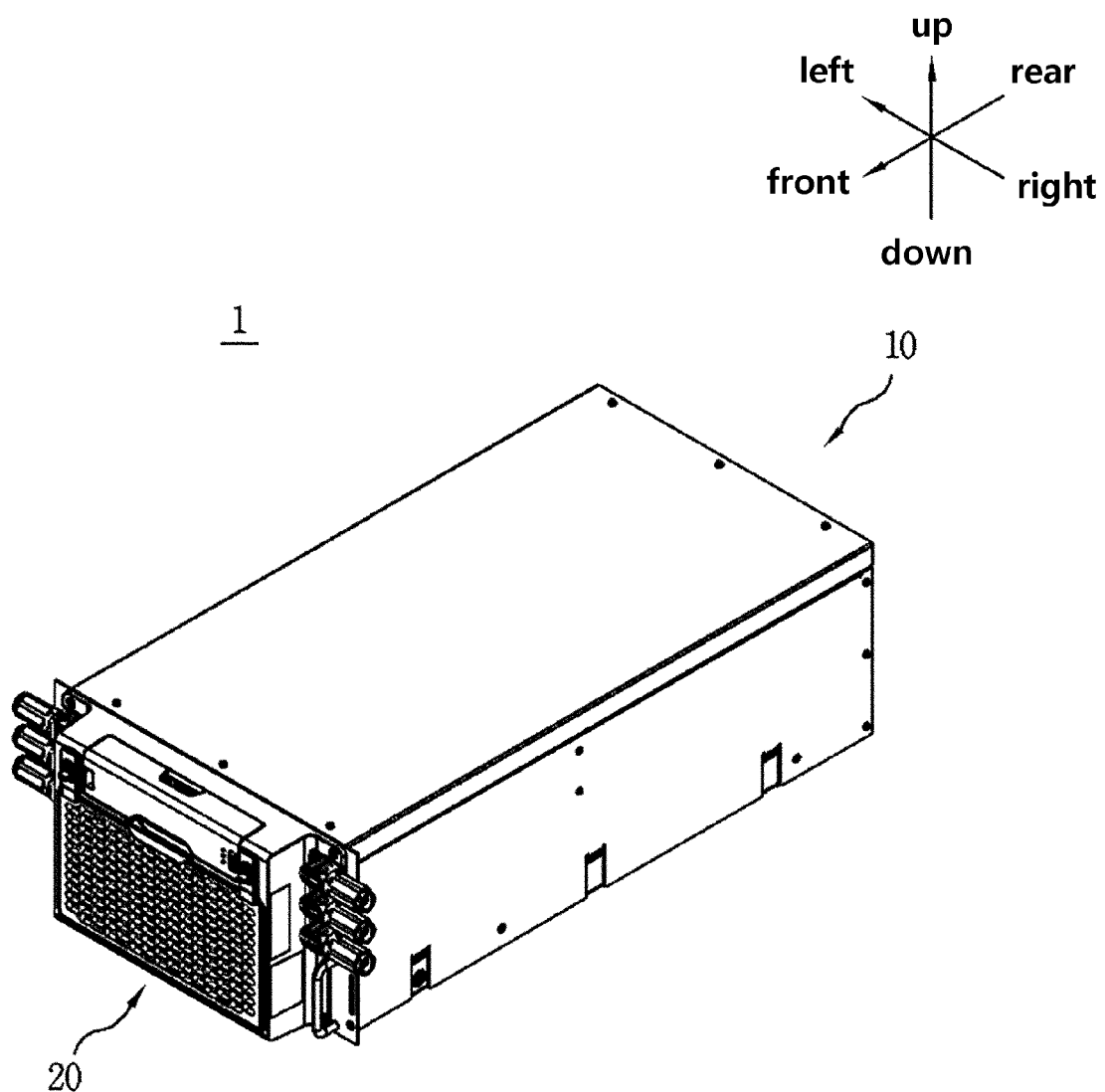
FIG. 1 is a perspective view illustrating a power conversion device according to an exemplary embodiment of the present disclosure.
Figure 2:
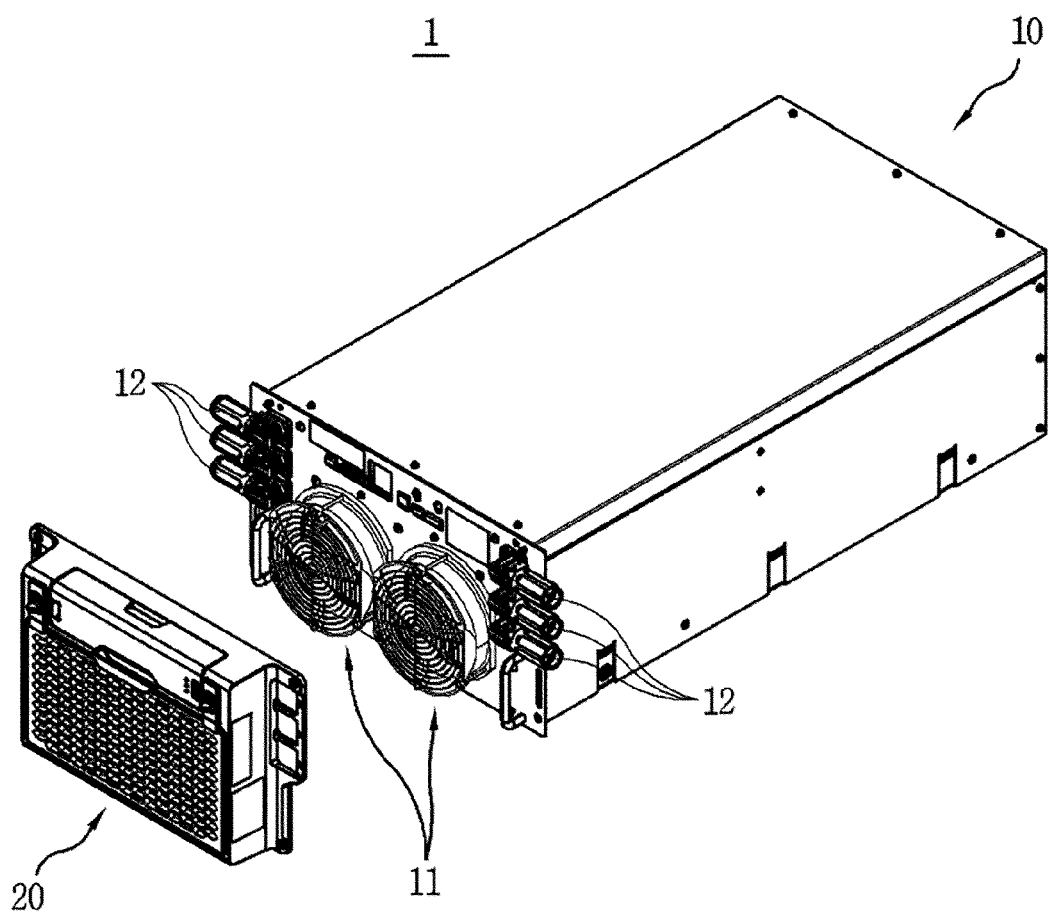
FIG. 2 is an exploded perspective view illustrating components of the power conversion device of FIG. 1.
Figure 3:
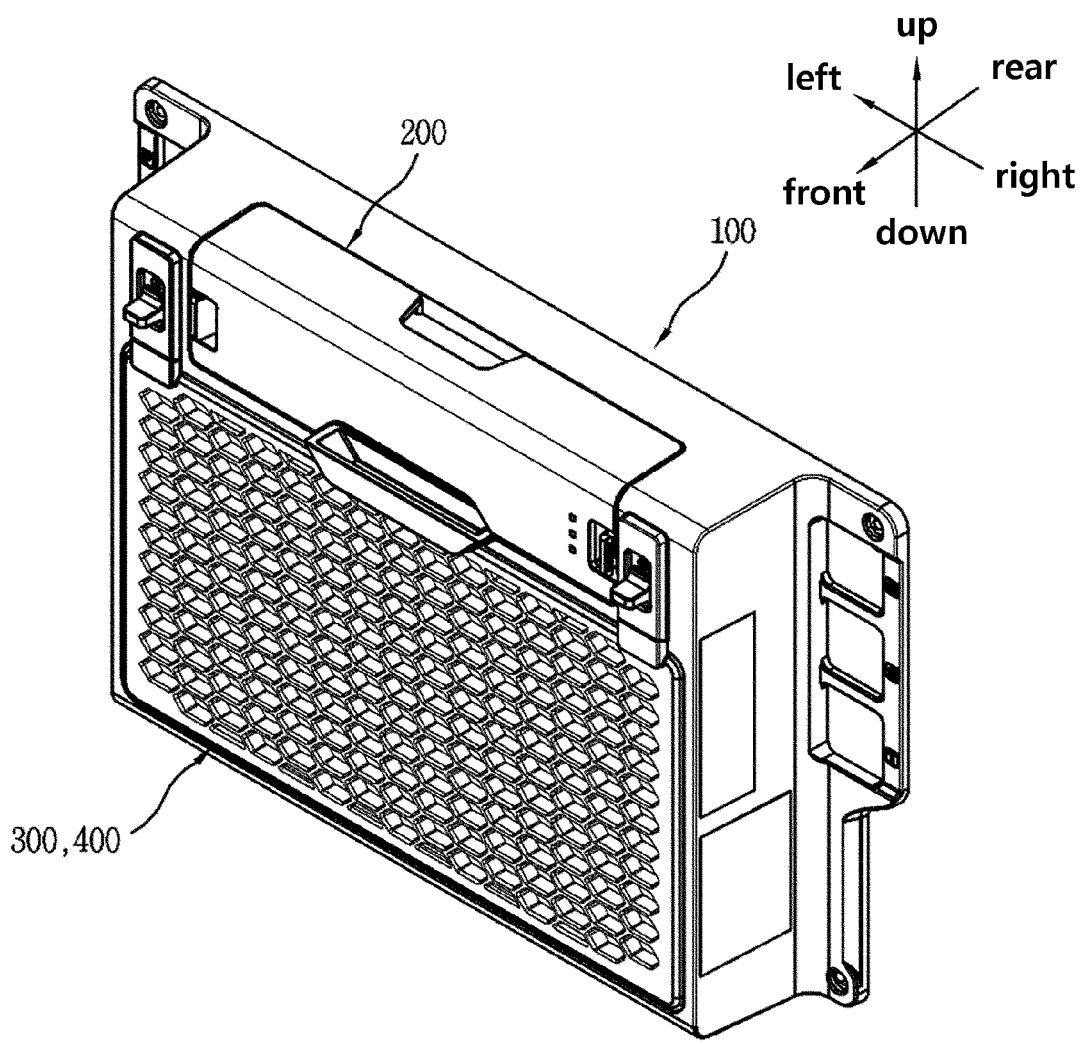
FIG. 3 is a perspective view illustrating a cover assembly provided in the power conversion device of FIG. 1.
Figure 4:
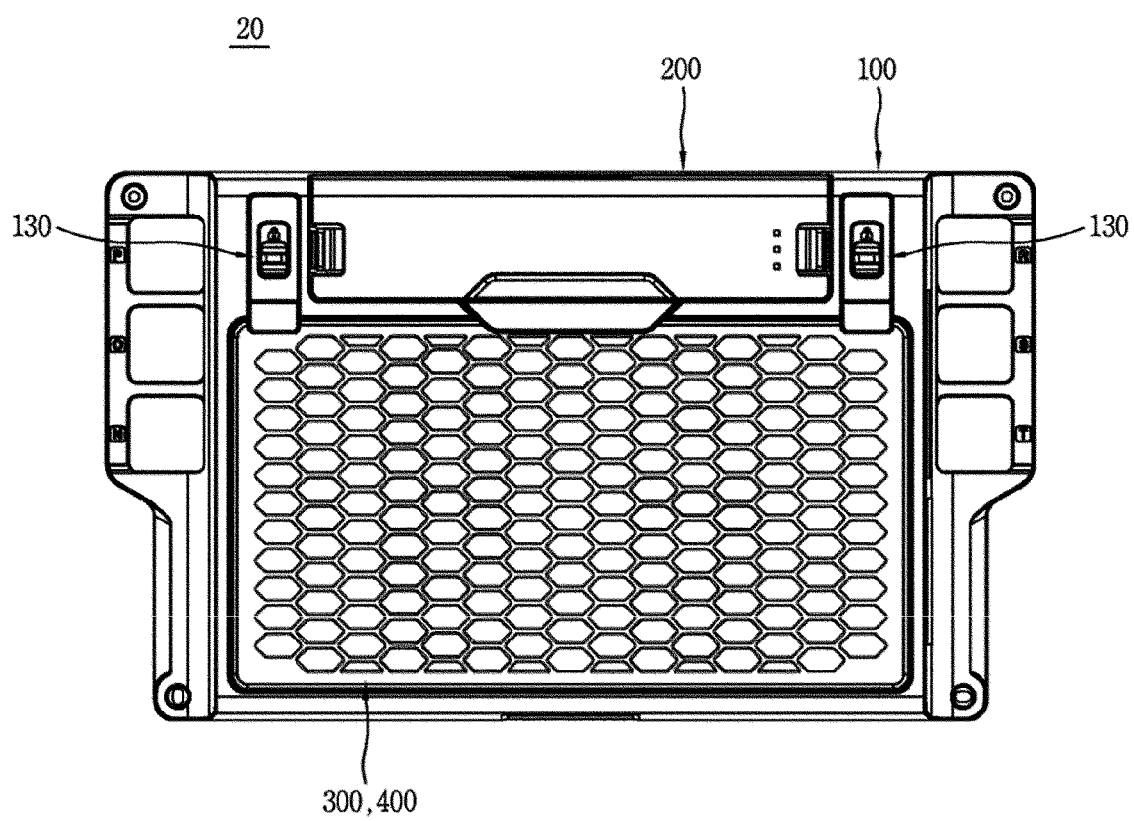
FIG. 4 is a front view illustrating the cover assembly of FIG. 3.
Figure 5:
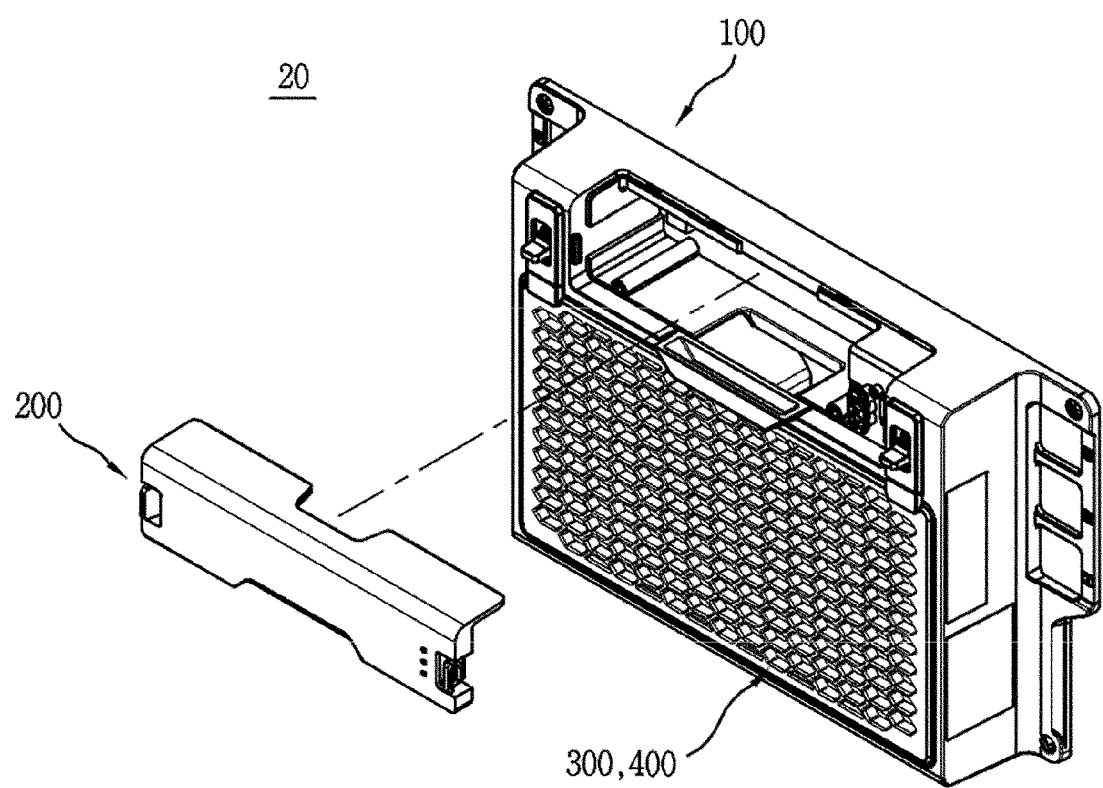
FIG. 5 is an exploded perspective view illustrating a process of removing a sub cover from the cover assembly of FIG. 3.
Figure 6:
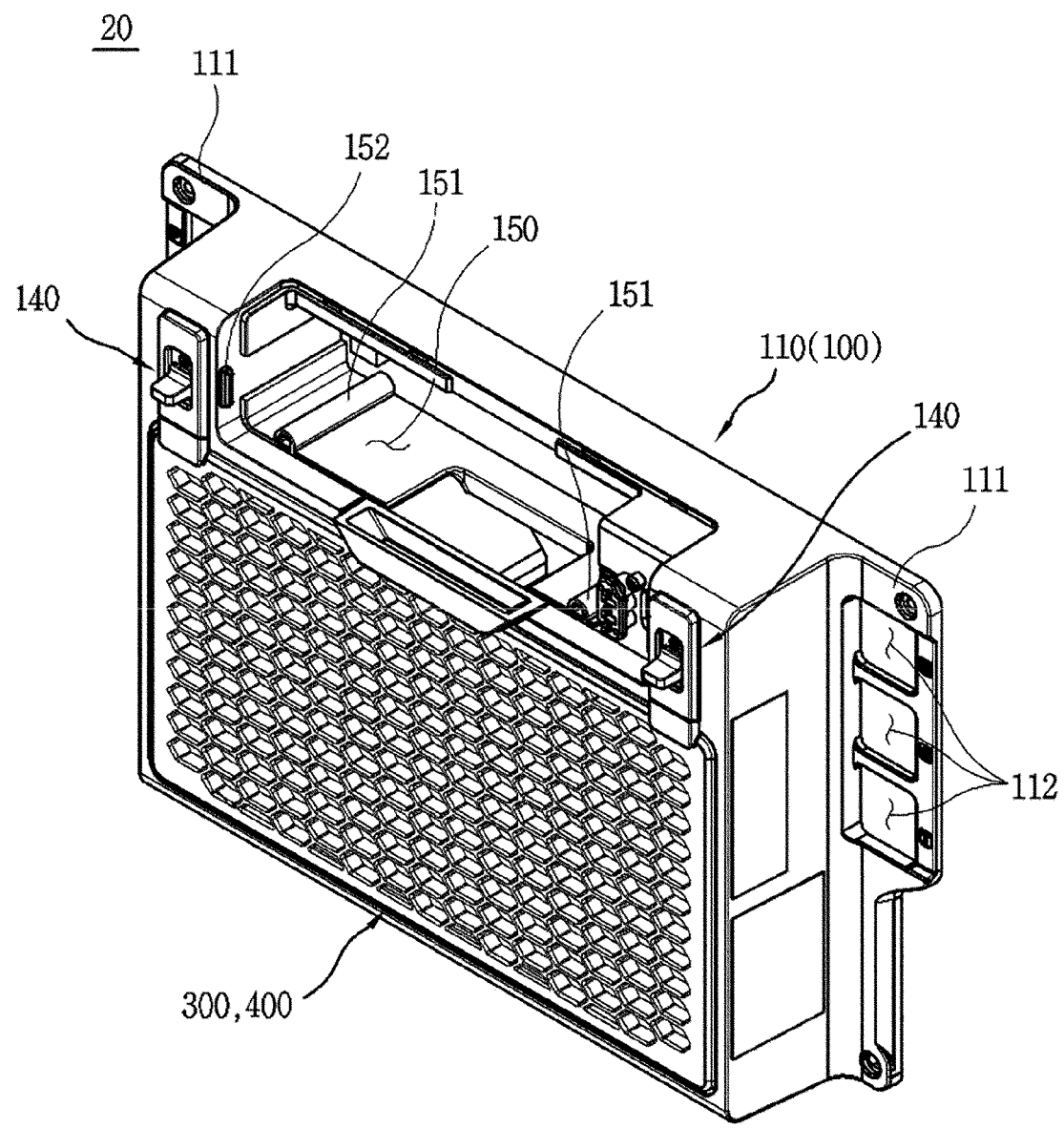
FIG. 6 is a perspective view illustrating a state in which a sub cover is removed from the cover assembly of FIG. 3.
Figure 7:
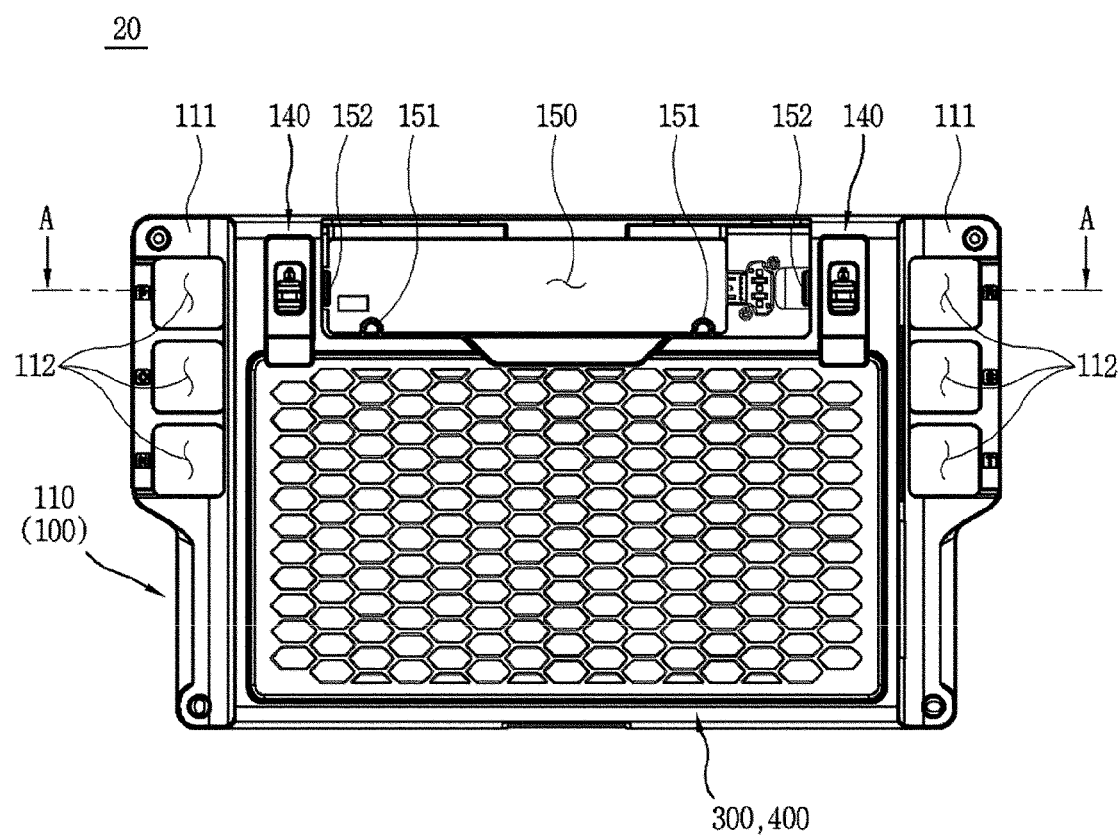
FIG. 7 is a front view illustrating the state of FIG. 6.

2. Description of a Configuration of the Power Conversion Device 1 According to an Embodiment of the Present Disclosure Referring to FIGS. 1 to 2, the power conversion device 1 according to an embodiment of the present disclosure includes an inverter device 10 and a cover assembly 20. In the following description, the inverter device 10 will be mainly described, but the cover assembly 20 will be described separately.

The inverter device 10 according to an embodiment of the present disclosure may be configured as a module. A plurality of modular inverter devices 10 may be provided, and may be electrically connected to each other.

Accordingly, the power conversion capacity of the power conversion device 1 constituted by the inverter device 10 can be adjusted to increase or decrease.

The inverter device 10 is electrically connected to an external power source and load. Specifically, the inverter device 10 may receive direct current and convert it into alternating current. The converted alternating current may be delivered to an external load.

Although not shown, the inverter device 10 may include a filter device (not shown). The filter device (not shown) may filter the converted alternating current to remove remaining noise components.

The inverter device 10 may extend in one direction, that is, in the front-rear direction in the illustrated embodiment. A space may be formed inside the inverter device 10. Various components required for the inverter device 10 to perform functions may be mounted in the space.

The cover assembly 20 may be detachably coupled to the inverter device 10. In the illustrated embodiment, the cover assembly 20 is detachably coupled to the front side of the inverter device 10.

It will be understood that the direction in which the cover assembly 20 is detachably coupled is a direction in which a blower fan 11, which will be described later, is exposed to the outside of the inverter device 10.

In the illustrated embodiment, the inverter device 10 includes a blower fan 11 and a terminal unit 12.

The blower fan 11 sucks in air for cooling components housed in the space of the inverter device 10. The blower fan 11 forms a conveying force for the outside air to flow into the space of the inverter device 10.

The blowing fan 11 is electrically connected to a control power (not shown). When the inverter device 10 is operated, the blower fan 11 may be operated according to a control signal applied from the control power (not shown).

The blower fan 11 communicates the space formed inside the inverter device 10 with the outside. That is, when the blower fan 11 is operated, external air may be introduced into the inverter device 10.

The blower fan 11 may be provided in any form capable of forming the flow of air by being operated by a control signal. In an embodiment, the blower fan 11 is rotationally operated by a motor (not shown) and may be provided in a form including a plurality of blades.

The blower fan 11 is rotatably coupled to the inverter device 10. In addition, the blower fan 11 is partially exposed to the outside of the inverter device 10. In the illustrated embodiment, the blower fan 11 is rotatably coupled to the front side surface of the inverter device 10, and the front side thereof is exposed to the outside.

A plurality of blower fans 11 may be provided. The plurality of blower fans 11 may be disposed adjacent to each other on the front side surface of the inverter device 10. In the illustrated embodiment, two blower fans 11 are provided, and the two blower fans 11 are disposed side by side in the left and right directions.

As will be described later, the blower fan 11 may be covered by the cover assembly Specifically, in a state where the cover assembly 20 is coupled to the inverter device 10, the blower fan 11 may be covered by the filter member 400 of the cover assembly 20.

In other words, in the above state, the blower fan 11 and the filter member 400 are disposed to be overlapped in a direction in which the cover assembly 20 is coupled to the inverter device 10, that is, in the front-rear direction in the illustrated embodiment.

Therefore, when the blower fan 11 is operated, external air passes through the filter member 400, is filtered, and then is introduced into the space formed inside the inverter device 10. Therefore, external dust or the like is not introduced into the inverter device 10 so that damage to the inverter device 10 may be prevented.

The terminal unit 12 electrically connects the inverter device 10 to an external power source and load. The DC current transmitted through the terminal unit 12 may be converted into AC current through the inverter device 10 and then transmitted to the external load.

The terminal unit 12 may be coupled to the cover assembly 20. Specifically, the terminal unit 12 may be coupled through a terminal opening 112 of a main body 110. Therefore, since the cover assembly 20 coupled to the inverter device 10 can be supported by the terminal unit 12, the coupling state of the inverter device 10 and the cover assembly can be stably maintained.

A plurality of terminal unit 12 may be provided. The plurality of terminal units 12 may be disposed spaced apart from each other. In addition, the plurality of terminal units 12 may be divided into terminals that at lease one or more thereof is electrically connected to an external power source and at least the other one or more thereof is electrically connected to an external load.

In the illustrated embodiment, the terminal unit 12 includes a terminal unit 12 located on the left side and a terminal unit 12 located on the right side.

In addition, a plurality of terminal units 12 electrically connected to an external power source or an external load, respectively, may be provided. In the illustrated embodiment, three terminal units 12 electrically connected to an external power source or an external load, respectively, are provided.

Respective three terminal units 12 are disposed side by side spaced apart from each other in the height direction of the inverter device 10, that is, in the vertical direction in the illustrated embodiment.

The number and arrangement of the terminal units 12 may be changed according to the number of phases of AC current converted by the inverter device 10. That is, it will be understood that the inverter device 10 according to the illustrated embodiment is configured to output three-phase current.

3. Description of the Cover Assembly 20 According to an Embodiment of the Present Disclosure Referring back to FIGS. 1 and 2, the power conversion device 1 according to an embodiment of the present disclosure includes a cover assembly 20.

The cover assembly 20 is detachably coupled to the inverter device 10. In addition, the cover assembly 20 is coupled to the inverter device 10 so as to cover one side of the inverter device 10, specifically, one side where the blower fan 11 is exposed to the outside.

In the illustrated embodiment, the cover assembly 20 is detachably coupled to the front side of the inverter device 10 while covering the blower fan 11.

The cover assembly 20 may be formed to allow air to communicate. In other words, air outside the cover assembly 20 may pass through the cover assembly 20 and be introduced into the inner space of the inverter device 10 through the blower fan 11.

Hereinafter, the cover assembly 20 according to an embodiment of the present disclosure will be described in detail with reference to FIGS. 3 to 20.

In the illustrated embodiment, the cover assembly 20 includes a main cover 100, a sub cover 200, a filter cover 300 and a filter member 400.

(1) Description of the Main Cover 100

The main cover 100 forms the body of the cover assembly 20. The main cover 100 is a part where the cover assembly 20 is coupled to the inverter device 10. As described above, the main cover 100 is detachably coupled to the cover assembly 20.

The main cover 100 covers the blower fan 11 and is coupled to the inverter device 10. In the illustrated embodiment, the blower fan 11 is located on the front side of the inverter device 10, and the main cover 100 is detachably coupled to the front side of the inverter device 10.

The terminal unit 12 is coupled to the main cover 100. Specifically, the terminal unit 12 is coupled through the terminal opening 112 formed in the main cover 100.

The main cover 100 may be formed to a size sufficient to cover the front side of the inverter device 10. In the illustrated embodiment, the length of the main cover 100 in the vertical direction is formed to be equal to or greater than the length of the front side of the inverter device 10 in the vertical direction. In addition, the length of the main cover 100 in the left and right directions is formed to be equal to or greater than the distance at which the plurality of terminal units 12 are spaced apart from each other.

The main cover 100 may be provided in any shape capable of covering the front side of the inverter device 10. In the illustrated embodiment, the main cover 100 has a rectangular shape in cross-section, and the width of the upper side thereof is larger than the width of the lower side thereof.

A space is formed inside the main cover 100. The blower fan 11 is accommodated in the space. In addition, the space communicates with the outside of the cover assembly 20.

Specifically, the space of the main cover 100 communicates with the direction passing through the filter member 400, that is, the front side in the illustrated embodiment. In addition, the space of the main cover 100 communicates with the direction toward the inverter device member 10, that is, the rear side in the illustrated embodiment.

Therefore, the air outside the power conversion device 1 may be filtered by passing through the filter member 400 by the conveying force applied by the blower fan 11, and then be introduced into the inside of the inverter device 1 through the space.

The sub cover 200 is detachably coupled to the main cover 100. In the illustrated embodiment, the sub cover 200 is coupled to the upper side of the front of the main cover 100.

The filter cover 300 and the filter member 400 are coupled to the main cover 100. Specifically, the filter member 400 is accommodated in a space formed inside the main cover 100, and the filter cover 300 is detachably coupled to the main cover 100 while covering the accommodated filter member 400 from the outside.

In the illustrated embodiment, the main cover 100 includes a main body 110, a communication part 120, an accommodation space part 130, a fastening part 140 and a main coupling part 150.

The main body 110 forms the exterior or body of the main cover 100. Each component of the above-described main cover 100, that is, the communication part 120, the accommodation space part 130, the fastening part 140 and the main coupling part 150 are located in the main body 110.

The main body 110 may be formed of a lightweight yet highly rigid material. This is to prevent an excessive increase in the total weight of the power conversion device 1 to which even the cover assembly 20 is coupled.

In addition, the main body 110 may be formed of a heat-resistant material. This is to prevent the cover assembly 20 coupled to the inverter device 10 from being damaged by heat generated from the inverter device 10.

The main body 110 may be divided into a plurality of areas. That is, the main body 110 may be divided into a part to which the sub cover 200 is coupled, a part to which the inverter device 10 is coupled, and a part to which the filter cover 300 and the filter member 400 are coupled.

In the illustrated embodiment, the part to which the sub cover 200 is coupled is located on the upper side of the main body 110. In addition, the part where the main body 110 is coupled to the inverter device 10 is located on the rear side, left side and right side of the main body 110, respectively. In addition, the part where the main body 110 is coupled to the filter cover 300 and the filter member 400 is located on the lower side of the front.

A detailed description of each part of the main body 110 will be described later.

In the illustrated embodiment, the main body 110 includes a wing part 111 and a terminal opening 112.

The wing part 111 is a part where the main body 110 is coupled to the inverter device 10. A through hole (reference numeral not indicated) is formed in the wing part 111, and a fastening member (not shown) fastening the main body 110 and the inverter device 10 may be coupled through thereto.

The wing part 111 is formed to extend toward the outside from the main body 110. In addition, a plurality of wing parts 111 may be provided. In the illustrated embodiment, two wing parts 111 are provided and are located at the left edge and the right edge of the main body 110, respectively.

In addition, in the illustrated embodiment, the wing part 111 is positioned to be biased toward the upper side of the main cover 100. This is due to the position of the terminal unit 12 passing through the terminal opening 112 formed in the wing part 111. Accordingly, it will be understood that the position of the wing part 111 can be changed according to the position of the terminal unit 12.

The terminal opening 112 is formed through the inside of the wing part 111.

The terminal unit 12 is coupled through the terminal opening 112. The terminal opening 112 is formed through the wing part 111 in the thickness direction, that is, in the front-rear direction in the illustrated embodiment. It will be understood that the direction through which the terminal opening 112 is formed is determined corresponding to a direction in which the terminal unit 12 extends.

In the illustrated embodiment, the terminal opening 112 has a rectangular cross-section and is formed as a rectangular plate-shaped space penetrating in the front-rear direction. The shape of the terminal opening 112 may be any shape into which the terminal unit 12 can be through-coupled.

The terminal opening 112 may be provided in a plurality of groups. A plurality of groups of terminal openings 112 may be formed in each of a plurality of wing parts 111, respectively. In the illustrated embodiment, the terminal openings 112 are provided in two groups and are respectively formed on the wing parts 111 located on the left and right sides.

In addition, the plurality of terminal openings 112 of each group may be provided in plurality. In addition, the plurality of terminal openings 112 may be spaced apart from each other and arranged side by side in one direction.

In the illustrated embodiment, each group includes three terminal openings 112, which are arranged side by side spaced apart from each other in the vertical direction.

Figure 10:
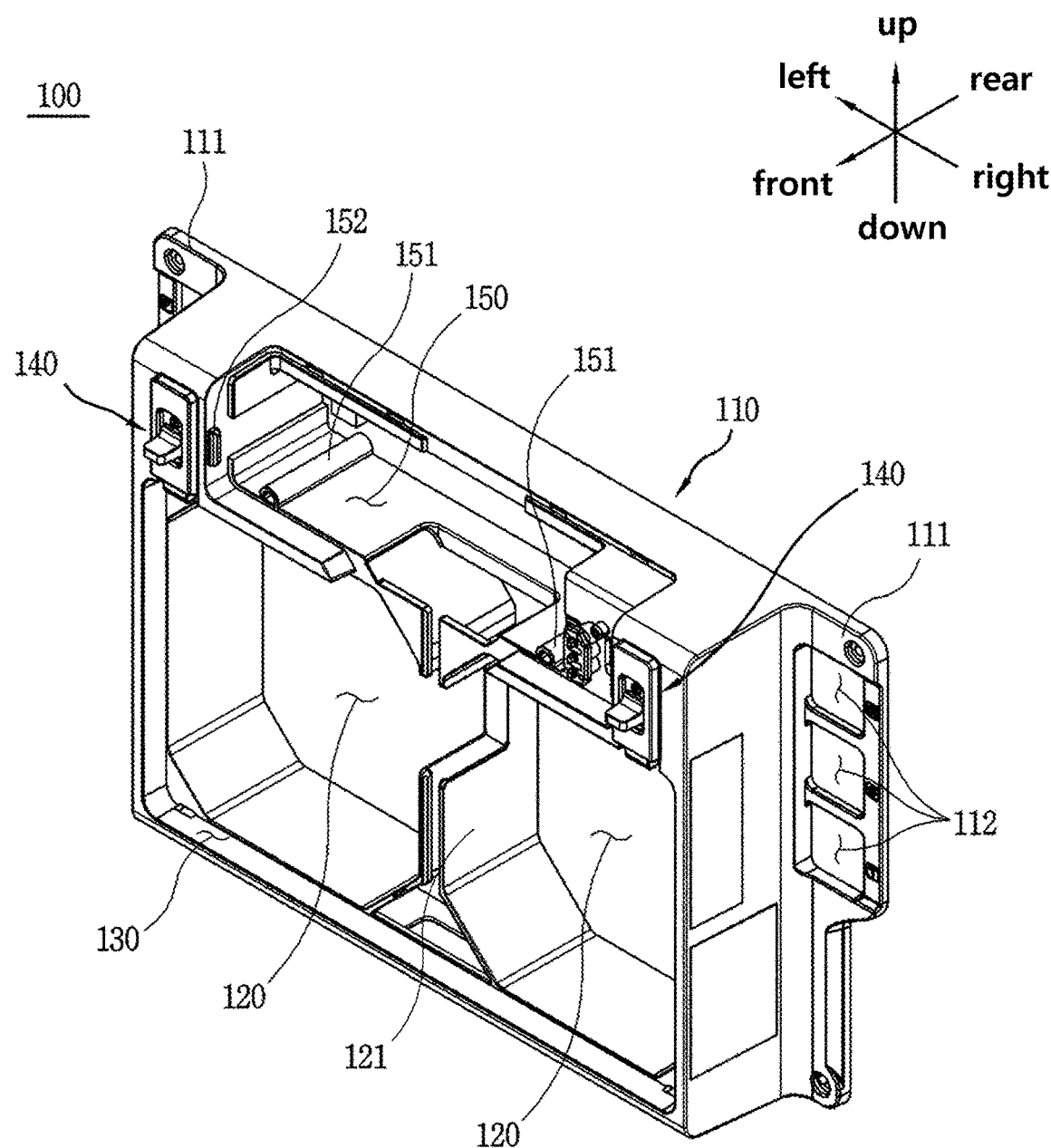
FIG. 10 is a perspective view illustrating a main cover provided in the cover assembly of FIG. 3.
Figure 11:
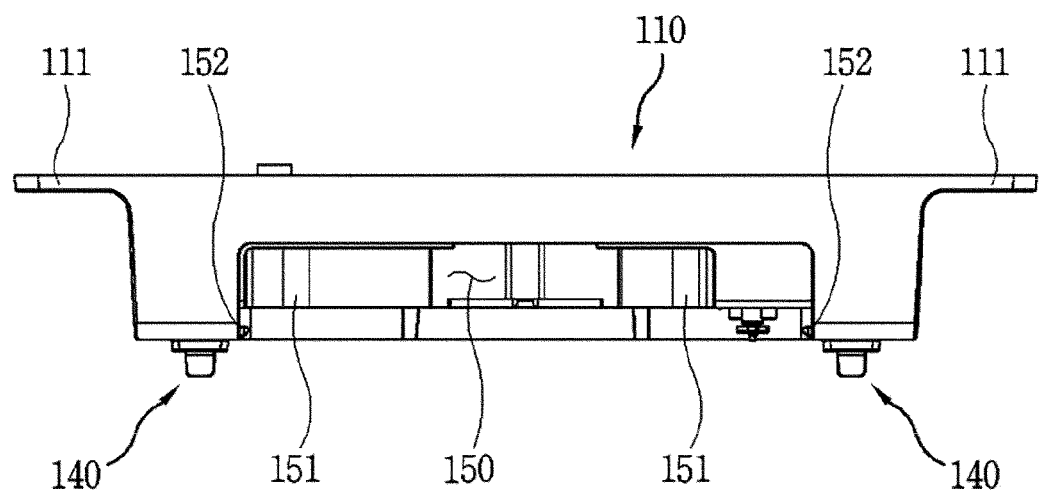
FIG. 11 is a plan view illustrating the main cover of FIG. 10.

The communication part 120 may be defined as a space formed inside the main cover 100 (best shown in FIG. 10). The blower fan 11 is accommodated in the communication part 120. When the blower fan 11 is operated in a state accommodated in the communication part 120, outside air from the outside of the main cover 100, that is, from the front side in the illustrated embodiment, may be introduced into the communication part 120.

The air introduced into the communication part 120 is introduced into the inverter device 10 by the conveying force applied by the operation of the blower fan 11. The introduced air may be used to cool heat generated from various components provided inside the inverter device 10.

The communication part 120 is formed inside the main body 110. The communication part 120 may be surrounded by an inner circumference of the main body 110. In the illustrated embodiment, any one or more directions of the upper and lower sides, and the left and right sides of the communication part 120 are surrounded by the inner circumference of the main body 110.

The communication part 120 is formed partially open. Outside air may be introduced into the communication part 120 through the open portion, and the introduced outside air may flow out into the inverter device 10. In the illustrated embodiment, the communication part 120 is formed open in a direction in which the cover assembly 20 is coupled to the inverter device 10, that is, in the front-rear direction.

In other words, the communication part 120 is formed through in the front-rear direction.

A plurality of communication parts 120 may be provided. A blower fan 11 may be accommodated in each of the plurality of communication parts 120. In the illustrated embodiment, two communication parts 120 are provided and disposed spaced apart from each other in the left and right directions. This is due to the fact that the number of blower fans 11 provided in the inverter device 10 according to the embodiment of the present disclosure is two.

The number of communication parts 120 may be changed according to the number of blower fans 11.

The plurality of communication parts 120 may be partitioned by a partition wall 121.

The partition wall 121 physically separates the plurality of communication parts 120. Accordingly, the conveying force applied by any one of the blower fans 11 accommodated in each communication part 120 is not interfered with by the conveying force applied by the other.

The partition wall 121 is positioned between the plurality of communication parts 120. As described above, in the illustrated embodiment, two communication parts 120 are provided and positioned to be spaced apart from each other in the left and right directions. The partition wall 121 is positioned between the two communication parts 120.

The partition wall 121 may extend in a direction physically separating the plurality of communication parts 120. In the illustrated embodiment, the partition wall 121 extends in the vertical direction and the front-rear direction.

The communication part 120 communicates with the accommodation space part 130.

The accommodation space part 130 is a space in which the filter member 400 is accommodated. In addition, the filter cover 300 supporting the filter member 400 from the outside, that is, from the front side in the illustrated embodiment, is inserted into the accommodation space part 130.

The accommodation space part 130 is formed on one side facing the filter cover 300 and the filter member 400, that is, on the front side in the illustrated embodiment. In other words, the accommodation space part 130 is formed on one side opposite to the inverter device 10.

The accommodation space part 130 is positioned to be biased toward any one of the up and down directions of the main cover 100. In the illustrated embodiment, the accommodation space part 130 is positioned to be biased toward the lower side of the main cover 100. The location of the accommodation space part 130 may be changed according to the locations of the communication part 120 and the blower fan 11.

Accordingly, air outside the cover assembly 20 may pass through the filter member 400 accommodated in the accommodation space part 130 and be filtered, and then be introduced into the inverter device 10.

The accommodation space part 130 communicates with the outside of the main cover 100. Specifically, the accommodation space part 130 communicates with the direction in which outside air to be introduced stays, that is, the front side in the illustrated embodiment.

The accommodation space part 130 communicates with the communication part 120. Air introduced into the accommodation space part 130 (i.e., air passing through the filter member 400) may be introduced into the communication part 120.

That is, the accommodation space part 130 is formed through in a direction in which the cover assembly 20 is coupled to the inverter device 10, that is, the front-rear direction in the illustrated embodiment.

The accommodation space part 130 is surrounded by the inner circumference of the main body 110. In the illustrated embodiment, the upper, lower, left and right sides of the accommodation space part 130 are surrounded by a portion located on the front side of the inner circumference of the main body 110.

The fastening part 140 fastens or unfastens the filter cover 300 and the filter member 400 accommodated in the accommodation space part 130 to or from the main cover 100. As the fastening part 140 is operated, the main cover 100 may remain coupled to the filter cover 300 and the filter member 400. In addition, as the fastening part 140 is operated, the filter cover 300 and the filter member 400 may be separated from the main cover 100.

The fastening part 140 is movably coupled to the main body 110. Specifically, the fastening part 140 may slide in one direction and in the other direction opposite to the one direction while being coupled to the main body 110. In the illustrated embodiment, the fastening part 140 is coupled to the main body 110 to be movable in the vertical direction.

A plurality of fastening parts 140 may be provided. The plurality of fastening parts 140 may be spaced apart from each other to bind or release the filter cover 300 and the filter member 400 at different locations.

As the fastening parts 140 bind the filter cover 300 and the filter member 400 at a plurality of locations, the coupled state between the main cover 100, the filter cover 300, and the filter member 400 may be stably maintained.

In the illustrated embodiment, two fastening parts 140 are provided and located spaced apart from each other in the left and right directions. In addition, each fastening part 140 is located to be biased toward the upper side of the main body 110.

In other words, each fastening part 140 is located on the upper side of the accommodation space part 130.

Figure 8:
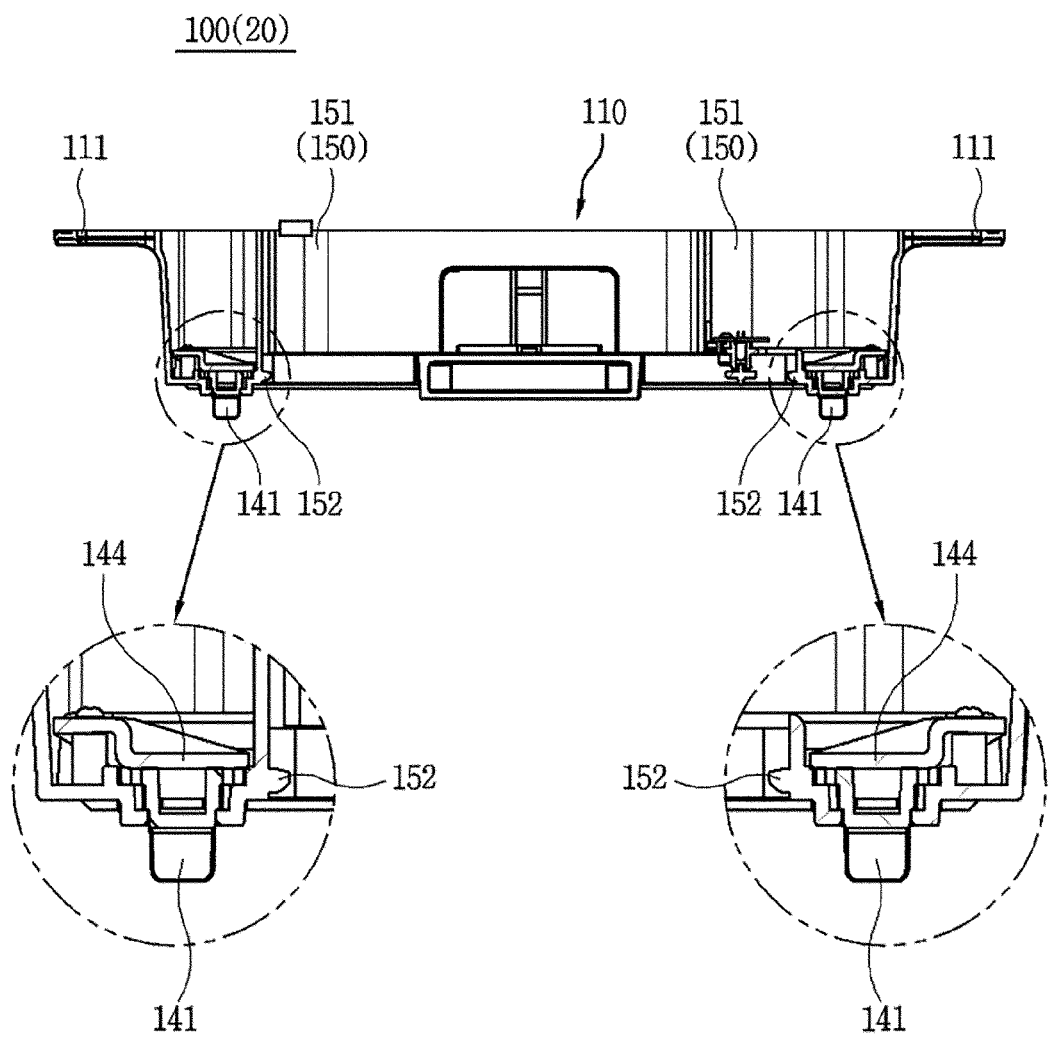
FIG. 8 is an A-A cross-sectional view illustrating the state of FIG. 6.
Figure 9:
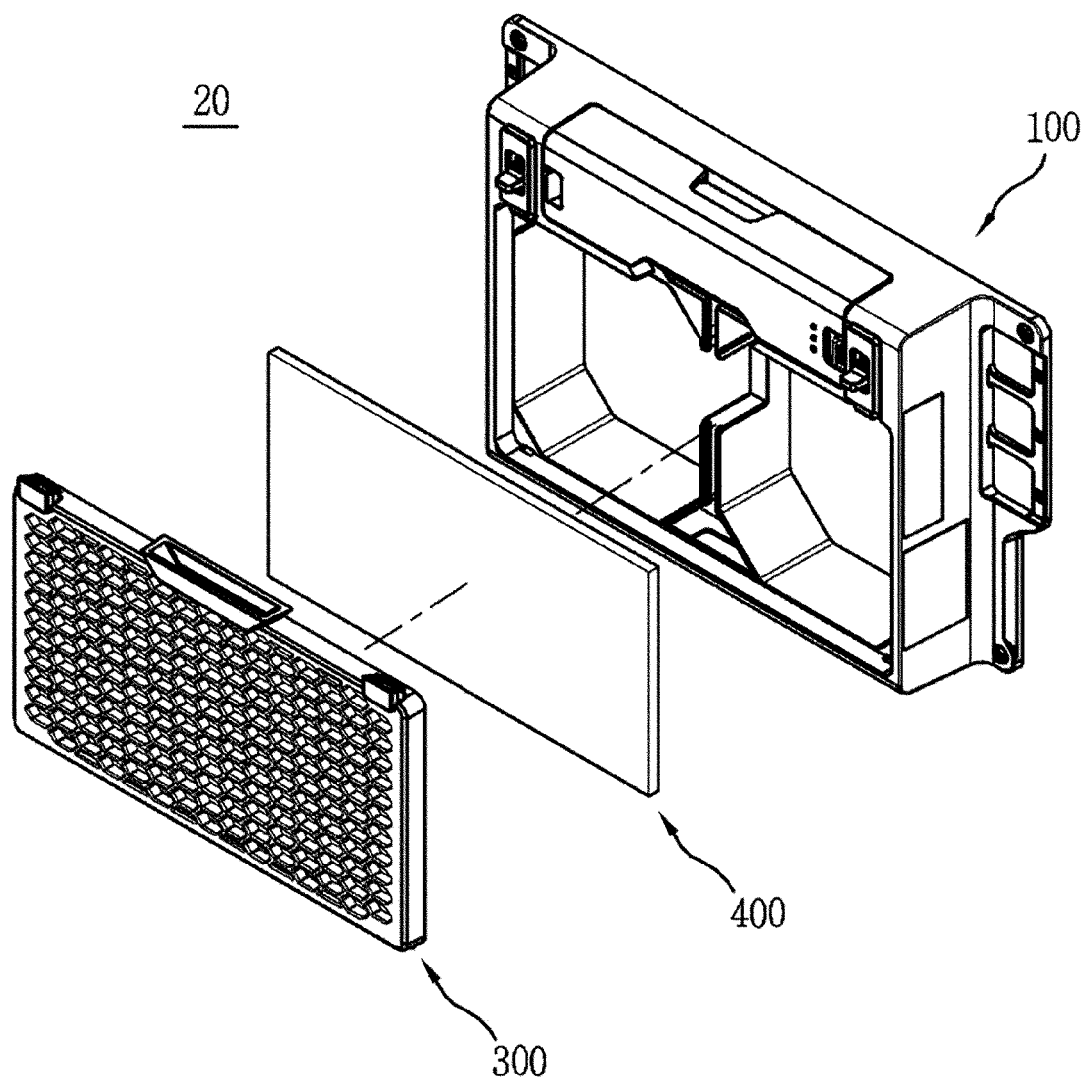
FIG. 9 is an exploded perspective view illustrating a process of removing a filter cover and a filter member from the cover assembly of FIG. 6.
Figure 22:
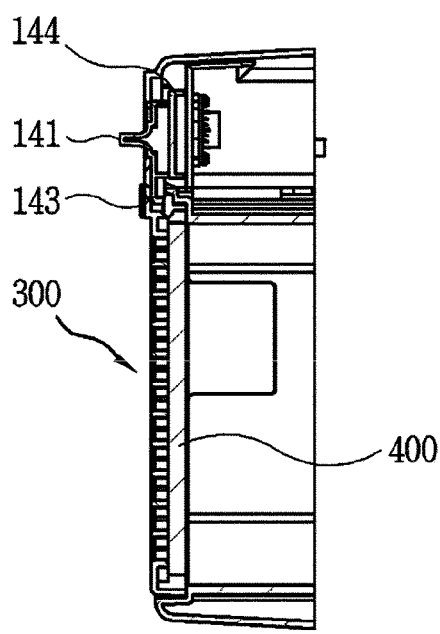
FIG. 22 is a C-C cross-sectional view (a) and a D-D cross-sectional view (b) illustrating a state in which a cover assembly is coupled to an inverter device, according to an exemplary embodiment of the present disclosure.
Figure 22:
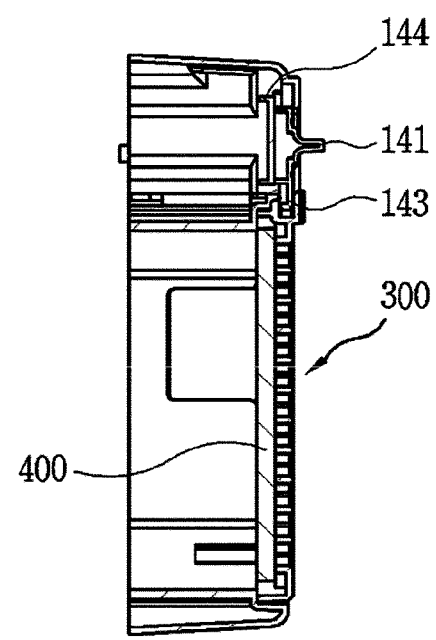
Figure 24:
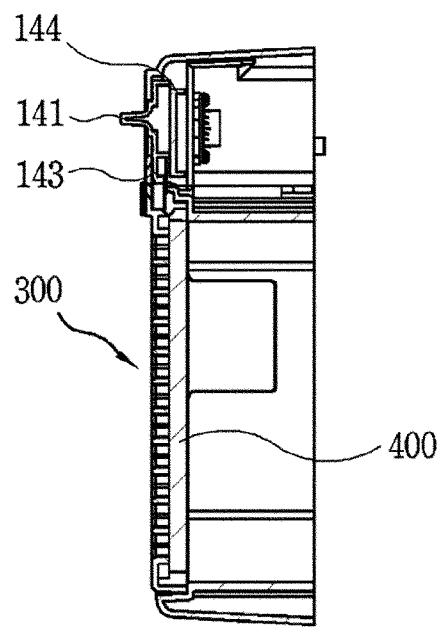
FIG. 24 is an E-E cross-sectional view (a) and an F-F cross-sectional view (b) illustrating a state in which a cover assembly can be separated from an inverter device, according to an exemplary embodiment of the present disclosure.
Figure 24:
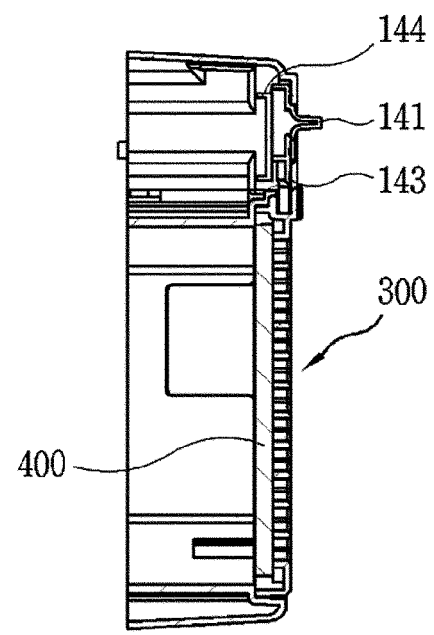

In the illustrated embodiment, the fastening part 140 includes a handle part 141, a coupling extension part 143, and a support member 144 (best shown in FIGS. 8, 22, and 24).

The handle part 141 is operated automatically or manually. As the handle part 141 is operated, the fastening part 140 can bind or release the filter cover 300 and the filter member 400.

In an embodiment in which the handle part 141 is manually operated, the handle part 141 may be operated by being pressed by an operator.

The handle part 141 is movably coupled to the main body 110. In the illustrated embodiment, the handle part 141 is coupled to the main body 110 to be movable in the vertical direction.

One portion of the handle part 141 is exposed to the outside of the main cover 100. An operator may operate the handle part 141 by pressing the exposed portion.

The one portion of the handle part 141 extends toward the outside of the main cover 100, that is, the front side in the illustrated embodiment. It will be appreciated that the direction in which the one portion of the handle part 141 extends is the direction opposite to the inverter device 10.

The other portion of the handle part 141 is accommodated inside the main cover 100. That is, the one portion of the handle part 141 penetrates the main body 110 in the extending direction, that is, in the front-rear direction in the illustrated embodiment.

The other portion of the handle part 141 is continuous with the one portion. Therefore, when the one portion of the handle part 141 is pressed, the other portion may also be moved together in the vertical direction.

The other portion of the handle part 141 extends in the direction in which the handle part 141 is moved, that is, in the vertical direction in the illustrated embodiment.

When the handle part 141 is pressed and moved upward, the upper side of the one portion of the handle part 141 may come into contact with the upper edge of the edges surrounding the opening through which the one portion passes.

In this case, the upper end of the other portion of the handle part 141 may come into contact with the upper side of the inner circumference of the main body 110. In the above state, the lower end of the coupling extension part 143 continuous with the other portion of the handle part 141 is positioned higher than the upper end of a restraining protrusion part 312 of the filter cover 300.

That is, in the above state, the coupling extension part 143 and the restraining protrusion part 312 are spaced apart from each other in the vertical direction. Therefore, the coupled filter cover 300 and filter member 400 are released and may be drawn out of the accommodation space part 130.

When the handle part 141 is pressed and moved downward, the lower end of the coupling extension part 143 continuous with the lower side of the one portion of the handle part 141 is positioned lower than the upper end of the restraining protrusion part 312 of the filter cover 300.

That is, in the above state, the coupling extension part 143 and the restraining protrusion part 312 are disposed to be overlapped in the front-rear direction. Therefore, the coupled filter cover 300 and filter member 400 are restrained, so they are not drawn out of the accommodation space part 130.

The handle part 141 is continuous with the coupling extension part 143.

The coupling extension part 143 is disposed to overlap or not to overlap with the restraining protrusion part 312 of the filter cover 300 in the front-rear direction. In other words, the lower end of the coupling extension part 143 is located above or below the upper end of the restraining protrusion part 312.

In a state in which the coupling extension part 143 does not overlap with the restraining protrusion part 312 in the front-rear direction, that is, in a state in which the lower end of the coupling extension part 143 is located above the upper end of the restraining protrusion part 312, the filter cover 300 and the filter member 400 may be separated from the main cover 100.

In addition, in a state in which the coupling extension part 143 overlaps with the restraining protrusion part 312 in the front-rear direction, that is, in a state in which the lower end of the coupling extension part 143 is located below the upper end of the restraining protrusion part 312, the filter cover 300 and the filter member 400 are not separated from the main cover 100.

The coupling extension part 143 is continuous with the handle part 141. In the illustrated embodiment, the coupling extension part 143 is continuous with the lower end of the other portion of the handle part 141. The coupling extension part 143 extends downward from the lower end of the other portion of the handle part 141.

The coupling extension part 143 may be moved together with the handle part 141. In the illustrated embodiment, the coupling extension part 143 may be lifted and lowered between a first position in which its lower end is positioned higher than the upper end of the restraining protrusion part 312 and a second position in which its lower end is positioned lower than the lower end of the restraining protrusion part 312.

The handle part 141 and the coupling extension part 143 are supported by the support member 144.

The support member 144 guides the movement of the handle part 141 and the coupling extension part 143 in the vertical direction. By the support member 144, the movement of the handle part 141 and the coupling extension part 143 in the front-rear direction is restricted. As a result, the handle part 141 and the coupling extension part 143 can be lifted and lowered stably.

The support member 144 is disposed in a space formed inside the main body 110. In an embodiment, the support member 144 may be fixed to the space formed inside the main body 110.

The support member 144 is disposed to face a through hole through which the one portion of the handle part 141 passes, with the handle part 141 and the coupling extension part 143 interposed therebetween. In the illustrated embodiment, the through hole (formed on the front side surface of the main body 110), the handle part 141 and the support member 144 are sequentially disposed from the front side toward the rear side.

That is, in the illustrated embodiment, the support member 144 supports the rear side of the handle part 141 and the coupling extension part 143.

The support member 144 extends in the direction in which the other portion of the handle part 141 or the coupling extension part 143 extends, that is, in the vertical direction in the illustrated embodiment.

When the handle part 141 is pressed upward, the upper end of the support member 144 may be positioned lower than the upper end of the handle part 141. In this case, the lower end of the support member 144 is positioned lower than the lower end of the handle part 141.

In addition, when the handle part 141 is pressed downward, the lower end of the support member 144 may be positioned higher than the lower end of the handle part 141. In this case, the upper end of the support member 144 is positioned higher than the upper end of the handle part 141.

Therefore, while the handle part 141 and the coupling extension part 143 are lifted and lowered, the support member 144 may support one or more ends of each end in a direction in which the handle part 141 extends.

Accordingly, the lifting and lowering of the handle part 141 and the coupling extension part 143 can be performed stably.

The main coupling part 150 is a part to which the sub cover 200 is coupled. The main coupling part 150 may be defined as a space formed inside the main cover 100.

A portion of the main coupling part 150 is formed open. In the illustrated embodiment, the upper and front sides of the main coupling part 150 are formed open. It will be understood that the portion of the main coupling part 150 may be covered by the sub cover 200.

The main coupling part 150 is located on the other side opposite to the accommodation space part 130, that is, on the upper side of the main body 110 in the illustrated embodiment. The location of the main coupling part 150 may be changed according to the location where the sub cover 200 is coupled to the main cover 100.

The main coupling part 150 may be formed in a shape corresponding to the shape of the sub cover 200. In the illustrated embodiment, the main coupling part 150 is formed as a rectangular pillar-shaped space in which an extension length in the left-right direction is longer than an extension length in the vertical direction and front-rear direction.

In a direction in which the main coupling part 150 extends longer, that is, on the outside of each end in the left-right direction in the illustrated embodiment, the fastening part 140 is located.

The main coupling part 150 is partially surrounded by the inner circumference of the main body 110. In the illustrated embodiment, the main coupling part 150 is surrounded by the inner circumference of the main body 110 except for the upper and front sides formed open.

In the illustrated embodiment, the main coupling part 150 includes a guide extension part 151 and a coupling protrusion 152.

The guide extension part 151 guides the sub cover 200 coupled to the main cover 100. The sub cover 200 may be coupled to or separated from the main cover 100 in a direction in which a guide bar 230 is coupled to or separated from the guide extension part 151.

Accordingly, coupling and separation between the main cover 100 and the sub cover 200 can be easily and stably performed.

The guide extension part 151 extends in a direction in which the sub cover 200 is coupled to and separated from the main cover 100. In the illustrated embodiment, the guide extension part 151 extends in the front-rear direction. It will be understood that the direction is the same as the extension direction of the one portion of the handle part 141.

A hollow is formed inside the guide extension part 151. The hollow extends in a direction in which the guide extension part 151 extends, that is, in the front-rear direction in the illustrated embodiment. The hollow extends to one end in a direction in which the guide extension part 151 extends, that is, to the front side end in the illustrated embodiment.

That is, the hollow is formed through in a direction in which the guide extension part 151 extends. The guide bar 230 of the sub cover 200 may be inserted through the hollow through the front side.

In the illustrated embodiment, the guide extension part 151 extends with an arc-shaped cross-section in the front-rear direction and has a cylinder shape having a hollow formed therein. The shape of the guide extension part 151 may be any shape to which the guide bar 230 can be coupled.

The guide extension part 151 may be disposed on any one of the inner circumference of the main body 110 surrounding the main coupling part 150. In the illustrated embodiment, the guide extension part 151 is disposed on the inner circumference of the main body 110 surrounding the main coupling part 150 from the lower side.

A plurality of guide extension parts 151 may be provided. The plurality of guide extension part 151 may be coupled to the guide bar 230 of the sub cover 200 at different locations. In the illustrated embodiment, two guide extension parts 151 are provided, and are spaced apart from each other in a direction in which the main coupling part 150 extends, that is, in the left-right direction.

The coupling protrusion 152 is detachably coupled to a sub coupling part 220 of the sub cover 200. The coupled state between the main cover 100 and the sub cover 200 can be stably maintained by coupling the coupling protrusion 152 and the sub coupling part 220. In an embodiment, the coupling protrusion 152 may be hook-fitted with the sub coupling part 220.

A plurality of coupling protrusions 152 may be provided. The plurality of coupling protrusions 152 may be detachably coupled to the sub coupling part 220 at different locations.

In addition, the coupling protrusion 152 may be disposed on any one or more of the inner circumference of the main body 110 surrounding the main coupling part 150.

In the illustrated embodiment, two coupling protrusions 152 are provided, and are respectively located on the inner circumference of the main body 110 surrounding the main coupling part 150 from left and right sides. That is, the two coupling protrusions 152 are spaced apart from each other in a direction in which the main coupling part 150 extends long, that is, in the left-right direction.

It will be appreciated that the number and arrangement of the coupling protrusions 152 may be changed according to the number and arrangement of the sub coupling parts 220.

The coupling protrusion 152 is formed to protrude toward the inside of the main coupling part 150. In the illustrated embodiment, the coupling protrusion 152 located on the left is formed to protrude toward the right. In addition, the coupling protrusion 152 located on the right side is formed to protrude toward the left.

Therefore, it can be said that the plurality of coupling protrusions 152 are formed to protrude toward each other.

In the illustrated embodiment, the coupling protrusion 152 has an extension length in the vertical direction longer than an extension length in the front-rear direction or the left-right direction. Accordingly, an area where the coupling protrusion 152 and the sub coupling part 220 are coupled is increased, so that the coupling between the main cover 100 and the sub cover 200 can be stably maintained.

The coupling protrusion 152 may have different shapes in the front-rear direction. That is, as shown in FIG. 8, the curvature of the front side surface of the coupling protrusion 152 may be greater than the curvature of the rear side surface thereof.

In other words, the front side surface of the coupling protrusion 152 is formed to be more inclined in the front-rear direction than the rear side surface.

Accordingly, due to the shape of the coupling protrusion 152 and the shape of a sub protrusion 221 of the sub coupling part 220, the sub protrusion 221 and the coupling protrusion 152 may be coupled only when the sub cover 200 is pressed toward the main cover 100.

Likewise, due to the shape of the coupling protrusion 152 and the shape of the sub-protrusion 221, the coupling protrusion 152 and the sub protrusion 221 coupled to each other are not arbitrarily separated unless an external force is applied.

(2) Description of the Sub Cover 200

Figure 12:
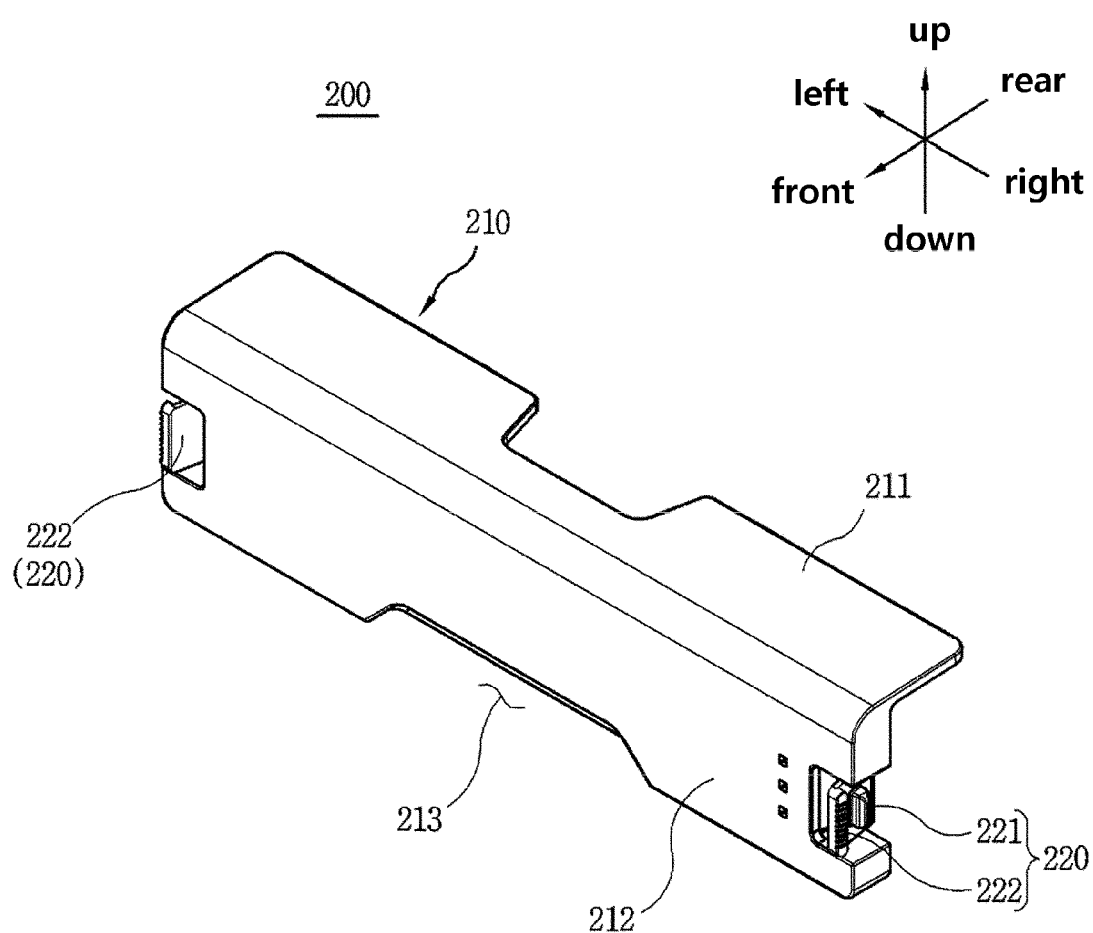
FIG. 12 is a perspective view illustrating a sub cover provided in the cover assembly of FIG. 3.
Figure 13:
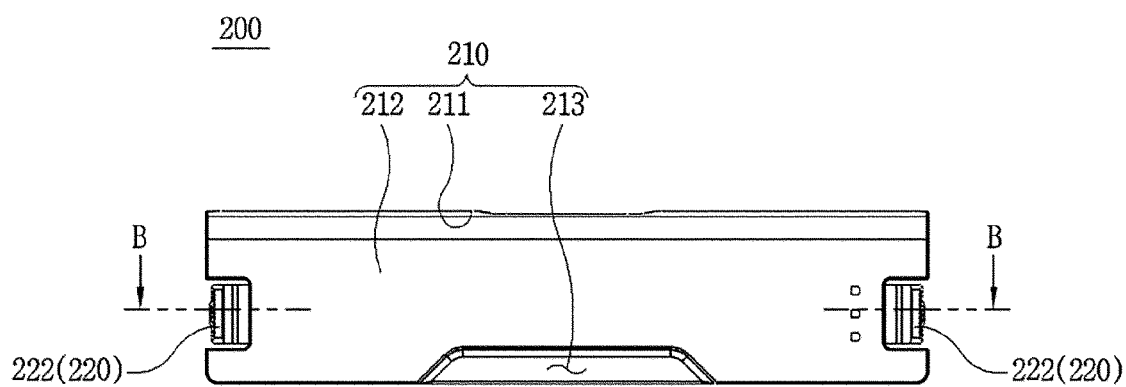
FIG. 13 is a front view illustrating the sub cover of FIG. 12.
Figure 16:
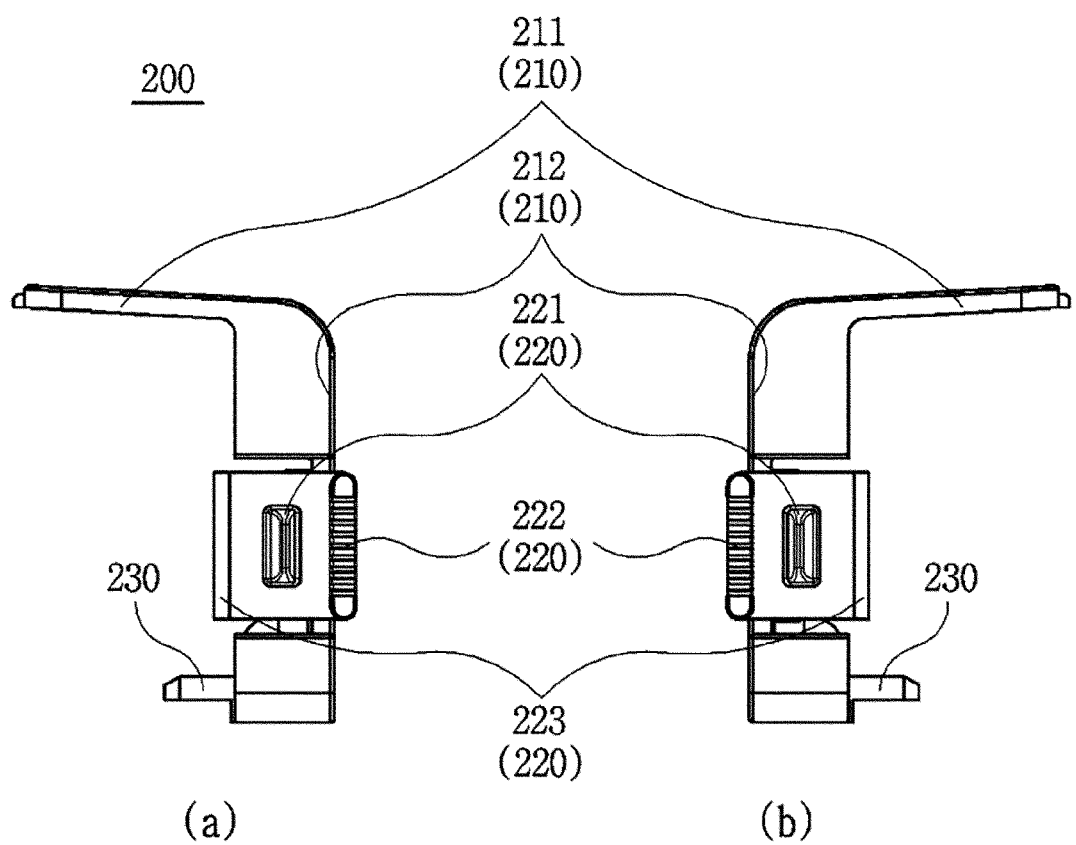
FIG. 16 is a left side view (a) and a right side view (b) illustrating the sub cover of FIG. 12.

Referring to FIGS. 12 and 16, the cover assembly 20 according to an embodiment of the present disclosure includes a sub cover 200.

The sub cover 200 is coupled to the main cover 100 and covers some components of the main cover 100. Due to the sub cover 200, said some components of the main cover 100 are not exposed to the outside.

The sub cover 200 is detachably coupled to the main cover 100. The sub cover 200 may be coupled by being pressed in a direction toward the main cover 100, that is, toward the rear side in the illustrated embodiment.

In addition, the sub cover 200 coupled to the main cover 100 is not separated from the main cover 100 arbitrarily unless an external force is applied. This is achieved by the sub coupling part 220 to be described later.

The sub cover 200 is coupled to the main coupling part 150 of the main cover 100. Specifically, the sub cover 200 covers the main coupling part 150 and is accommodated in the main coupling part 150.

In the illustrated embodiment, the sub cover 200 includes a sub body 210, a sub coupling part 220 and a guide bar 230.

The sub body 210 forms the exterior or body of the sub cover 200. In the sub body 210, each component of the above-described sub cover 200, that is, the sub coupling part 220 and the guide bar 230 are positioned.

The sub body 210 may be formed of a lightweight yet highly rigid material. This is to prevent an excessive increase in the total weight of the power conversion device 1 to which the cover assembly 20 is coupled.

In addition, the sub body 210 may be formed of a heat-resistant material. This is to prevent damage caused by high heat generated from the inverter device 10.

In an embodiment, the sub body 210 may be formed of a synthetic resin material such as reinforced plastic or a ceramic material.

In the illustrated embodiment, the sub body 210 includes a first sub surface 211, a second sub surface 212 and a gripping space part 213.

The first sub surface 211 forms part of the frame of the sub body 210. In addition, the first sub surface 211 forms one surface of the sub body 210. In the illustrated embodiment, the first sub surface 211 forms an upper side surface of the sub body 210.

The first sub surface 211 extends in one direction, that is, the left-right direction in the illustrated embodiment. It will be understood that the one direction in which the first sub surface 211 extends is the same as the direction in which the main coupling part 150 extends.

A groove is formed at one edge facing the main cover 100 among edges in the direction in which the first sub surface 211 extends short, that is, at one edge at the rear side in the illustrated embodiment. The groove is formed to be recessed at the rear side edge.

The groove communicates the outside with the main coupling part 150 covered by the sub cover 200. An operator may grip the sub cover 200 through the groove.

The first sub surface 211 is continuous with the second sub surface 212.

The second sub surface 212 forms the remaining part of the frame of the sub body 210. In addition, the second sub surface 212 forms the other surface of the sub body 210. In the illustrated embodiment, the second sub surface 212 forms a front side surface of the sub body 210.

The second sub surface 212 extends in the one direction, that is, the left-right direction in the illustrated embodiment. It will be understood that the one direction in which the second sub surface 212 extends is also the same as the direction in which the main coupling part 150 extends.

The second sub surface 212 is continuous with the first sub surface 211. That is, each edge where the first sub surface 211 and the second sub surface 212 face each other is continuous with each other. In the illustrated embodiment, the front side edge of the first sub surface 211 and the upper side edge of the second sub surface 212 are continuous with each other.

The second sub surface 212 and the first sub surface 211 may be continuous at a predetermined angle. In an embodiment, the predetermined angle may be a right angle.

The shapes of the first sub surface 211 and the second sub surface 212 may be changed according to the shape of the sub coupling part 220.

The sub coupling part 220 is positioned at each end in a direction in which the second sub surface 212 extends, that is, at the left end and the right end in the illustrated embodiment.

The gripping space part 213 is a space into which an operator inserts a hand or a tool or the like to grip the filter cover 300.

The gripping space part 213 is formed to be recessed at one edge of the second sub surface 212 facing the filter cover 300. In the illustrated embodiment, the gripping space part 213 is formed to be recessed at the lower side edge of the second sub surface 212. It is preferable that the length to which the gripping space part 213 is recessed is determined to be sufficient to insert an operator's hand or tool.

The gripping space part 213 is positioned adjacent to a gripping part 311 of the filter cover 300. In the illustrated embodiment, the gripping space part 213 is located at the center of the lower side edge of the second sub surface 212 in the left-right direction.

The position of the gripping space part 213 may be changed according to the position of the gripping part 311.

The sub coupling part 220 is a part where the sub cover 200 is fastened to the main cover 100. The sub cover 200 may be detachably coupled to the main cover 100 by the sub coupling part 220.

The sub coupling part 220 is detachably coupled to the coupling protrusion 152 of the main cover 100. In an embodiment, the sub coupling part 220 and the coupling protrusion 152 may be hook-fitted.

A plurality of sub coupling parts 220 may be provided. The plurality of sub coupling parts 220 may be provided at different positions of the sub cover 200. In the illustrated embodiment, two sub coupling parts 220 are provided and positioned at the left and right ends of the second sub surface 212, respectively.

The position of the sub coupling part 220 may be changed according to the position of the coupling protrusion 152 of the main cover 100.

As a plurality of sub coupling parts 220 are provided, the sub cover 200 may be coupled to the main cover 100 at a plurality of positions. Accordingly, the coupled state between the sub cover 200 and the main cover 100 can be stably maintained.

After the sub coupling part 220 is pressed by an external force to store restoring force and is deformed, the coupled state of the sub cover 200 and the main cover 100 can be stably maintained by the restoring force.

To this end, the sub coupling part 220 may be formed of a material capable of performing predetermined shape deformation.

Figure 14:
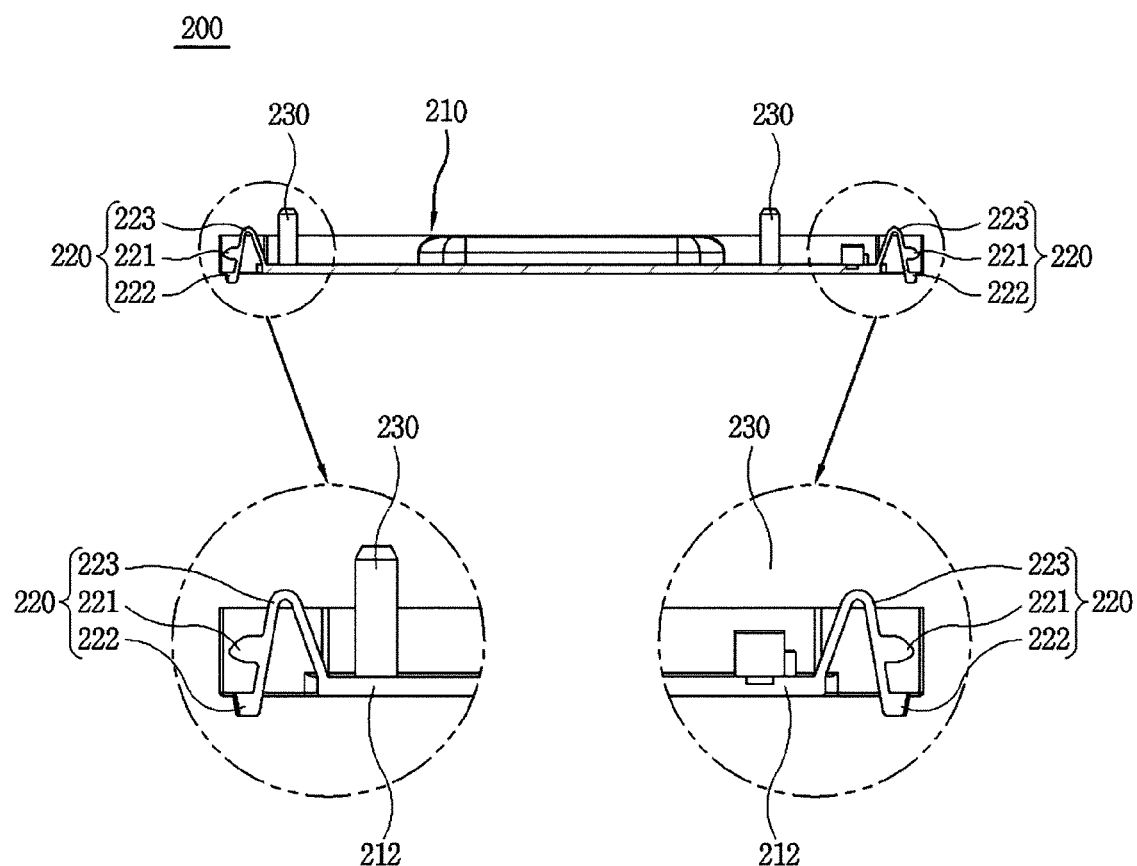
FIG. 14 is a B-B cross-sectional view illustrating the sub cover of FIG. 12.
Figure 15:
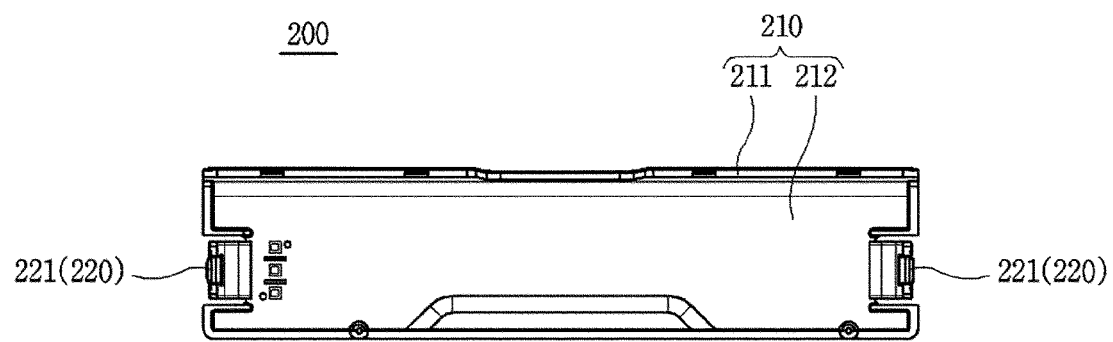
FIG. 15 is a rear view illustrating the sub cover of FIG. 12.

In the illustrated embodiment, the sub coupling part 220 includes a sub protrusion 221, a pressing protrusion 222, and an elastic part 223 (best shown in FIG. 14).

The sub protrusion 221 is coupled to the coupling protrusion 152 to maintain a coupled state between the sub cover 200 and the main cover 100.

The sub protrusion 221 is formed to protrude outward from the second sub surface 212. As described above, a plurality of sub coupling parts 220 may be provided and positioned at the left and right ends of the second sub surface 212, respectively.

In the above embodiment, the sub protrusion 221 positioned on the left protrudes toward the left, and the sub protrusion 221 positioned on the right protrudes toward the right.

As described above, a plurality of coupling protrusions 152 are also provided, extending toward each other on each surface surrounding the main coupling part 150 from left and right sides.

At this time, in a state in which an external force is not applied, the sub protrusion 221 and the coupling protrusion 152 may be disposed to overlap each other in the front-rear direction. That is, the end of the sub protrusion 221 may overlap the coupling protrusion 152 in the front-rear direction, and the end of the coupling protrusion 152 may overlap the sub protrusion 221 in the front-rear direction.

Therefore, unless an external force is applied, the sub protrusion 221 does not pass through the coupling protrusion 152. Accordingly, the coupled state between the sub cover 200 and the main cover 100 can be stably maintained.

The sub protrusion 221 is positioned to be spaced apart from the pressing protrusion 222. In the illustrated embodiment, the sub protrusion 221 is positioned at the rear side of the pressing protrusion 222 to be spaced apart from the pressing protrusion 222 by a predetermined distance. The coupling protrusion 152 is accommodated in a space formed by separating the sub protrusion 221 and the pressing protrusion 222.

The sub protrusion 221 is connected to the elastic part 223. As will be described later, when the elastic part 223 is curved as the pressing protrusion 222 is pressed, the sub protrusion 221 may be moved together with the elastic part 223. At this time, the sub protrusion 221 is moved in a direction opposite to the coupling protrusion 152, that is, toward the inside. In the illustrated embodiment, it will be understood that when the pressing protrusion 222 is pressed, the sub protrusion 221 located on the left side moves toward the right side, and the sub protrusion 221 located on the right side moves toward the left side.

Accordingly, the sub protrusion 221 and the coupling protrusion 152 do not overlap in the front-rear direction. In other words, the sub protrusion 221 and the coupling protrusion 152 are spaced apart from each other in the left-right direction.

In the above state, the sub cover 200 may be coupled to the main cover 100 or separated from the main cover 100. In other words, the sub cover 200 coupled to the main cover 100 is not arbitrarily separated from the main cover 100 unless an external force is applied.

The pressing protrusion 222 is a part to which an external force is applied to move the elastic part 223 and the sub protrusion 221 connected to the elastic part 223. In an embodiment, the pressing protrusion 222 may be pressed by an operator.

The pressing protrusion 222 is positioned to be spaced apart from the sub protrusion 221 in a direction opposite to the main cover 100. In the illustrated embodiment, the pressing protrusion 222 is positioned on the front side of the sub protrusion 221.

A portion of the pressing protrusion 222 is exposed to the outside of the sub body 210. The outer end of the pressing protrusion 222, that is, the front side and the left side or right side ends in the illustrated embodiment, are exposed to the outside of the second sub surface 212.

That is, the front side and left side ends of the pressing protrusion 222 located on the left side end of the second sub surface 212 are exposed to the outside. In addition, the front side and right side ends of the pressing protrusion 222 located on the right side end of the second sub surface 212 are exposed to the outside.

Accordingly, the operator may press the portions where the pressing protrusions 222 are exposed to the outside to couple the sub cover 200 to the main cover 100 or to separate the sub cover 200 from the main cover 100.

The pressing protrusion 222 is continuous with the elastic part 223. When the pressing protrusion 222 is pressed inward, the elastic part 223 is deformed and the sub protrusion 221 may be moved. In the illustrated embodiment, the pressing protrusion 222 is continuous with one end, that is, the front end of the elastic part 223.

Each pressing protrusion 222 located on the left and right sides is continuous outward in a direction in which the second sub surface 212 extends, that is, to the left and right respectively in the illustrated embodiment. As described above, each sub protrusion 221 located on the left and right sides is also continuous in the same direction as the pressing protrusion 222.

Thus, a predetermined space is formed between the sub protrusion 221 and the pressing protrusion 222. As described above, the coupling protrusion 152 is drawably inserted into the predetermined space.

As an external force is applied, the elastic part 223 is deformed in shape and stores restoring force. Due to the restoring force stored by the elastic part 223, the coupled state between the sub cover 200 and the main cover 100 can be stably maintained.

The elastic part 223 is coupled to the sub protrusion 221. The sub protrusion 221 may be moved inward or outward of the second sub surface 212 as the elastic part 223 is deformed in shape.

The elastic part 223 is coupled to the pressing protrusion 222. The elastic part 223 may be deformed in shape as the pressing protrusion 222 is pressed toward the inside.

The elastic part 223 is coupled to the second sub surface 212. In the illustrated embodiment, the elastic part 223 is continuous with the left and right ends of the second sub surface 212, respectively.

In the illustrated embodiment, the elastic part 223 includes at least one bent part. The bent part may be located on the rear side of the sub coupling part 220. The bent part may be deformed in shape by an external force applied to the pressing protrusion 222.

The bent part may be formed by a portion in which a plurality of plates are continuous with each other. In the illustrated embodiment, the bent part is formed by connecting rear side ends of the two plates to each other. That is, in the above embodiment, the shape of the elastic part 223 is a 'V' shape.

Specifically, when an external force in an inward direction is applied to the pressing protrusion 222, the distance between the plurality of plates forming the bent part is reduced. Accordingly, the sub protrusion 221 may also be moved inward, so that the sub protrusion 221 and the coupling protrusion 152 may be spaced apart from each other in the left-right direction.

As described above, the elastic part 223 is formed of a material having elasticity, and thus may be deformed in shape and store restoring force. When the external force applied to the pressing protrusion 222 disappears, the elastic part 223 is restored to its initial shape. That is, the distance between the plurality of plates forming the bent part is increased, and the original shape is restored.

Accordingly, the sub protrusion 221 may be also moved outward, so that the coupling protrusion 152 may be accommodated in a space formed between the sub protrusion 221 and the pressing protrusion 222. Through the above process, the sub coupling part 220 and the coupling protrusion 152 are coupled.

The guide bar 230 restrains a direction in which the sub cover 200 is coupled to the main cover 100. By the guide bar 230, the sub cover 200 may be coupled to the main cover 100 only in a preset direction.

The guide bar 230 extends from the sub body 210 toward the main cover 100, that is, toward the rear side in the illustrated embodiment. The guide bar 230 is located on one side of the sub body 210 opposite to the first sub surface 211, that is, on the lower side of the rear in the illustrated embodiment.

The guide bar 230 may have a predetermined cross-section and be formed in a pillar shape extending toward the main cover 100. In the illustrated embodiment, the guide bar 230 has a circular cross-section and is formed in a cylindrical shape extending toward the rear side. The shape of the guide bar 230 may be changed according to the shape of the hollow part formed inside the guide extension part 151.

In this case, the end of the guide bar 230 is tapered, so that it can be easily coupled with the guide extension part 151.

The guide bar 230 is coupled to the guide extension part 151 of the main cover 100. Specifically, the guide bar 230 is drawably inserted and coupled to a hollow part formed through the inside of the guide extension part 151.

Therefore, it will be understood that the sub cover 200 may be coupled to the main cover 100 only in a direction in which the guide bar 230 is inserted into the hollow part of the guide extension part 151.

A plurality of guide bars 230 may be provided. The plurality of guide bars 230 may extend from the sub body 210 toward the main cover 100 at different locations. In the illustrated embodiment, two guide bars 230 are provided and disposed spaced apart from each other in the left and right directions.

The plurality of guide bars 230 may be respectively inserted into and coupled to hollow parts formed inside the plurality of guide extension parts 151. As the coupling direction of the sub cover 200 is guided in a plurality of locations, the coupling process between the sub cover 200 and the main cover 100 can be stably performed.

(3) Description of the Filter Cover 300

Figure 17:
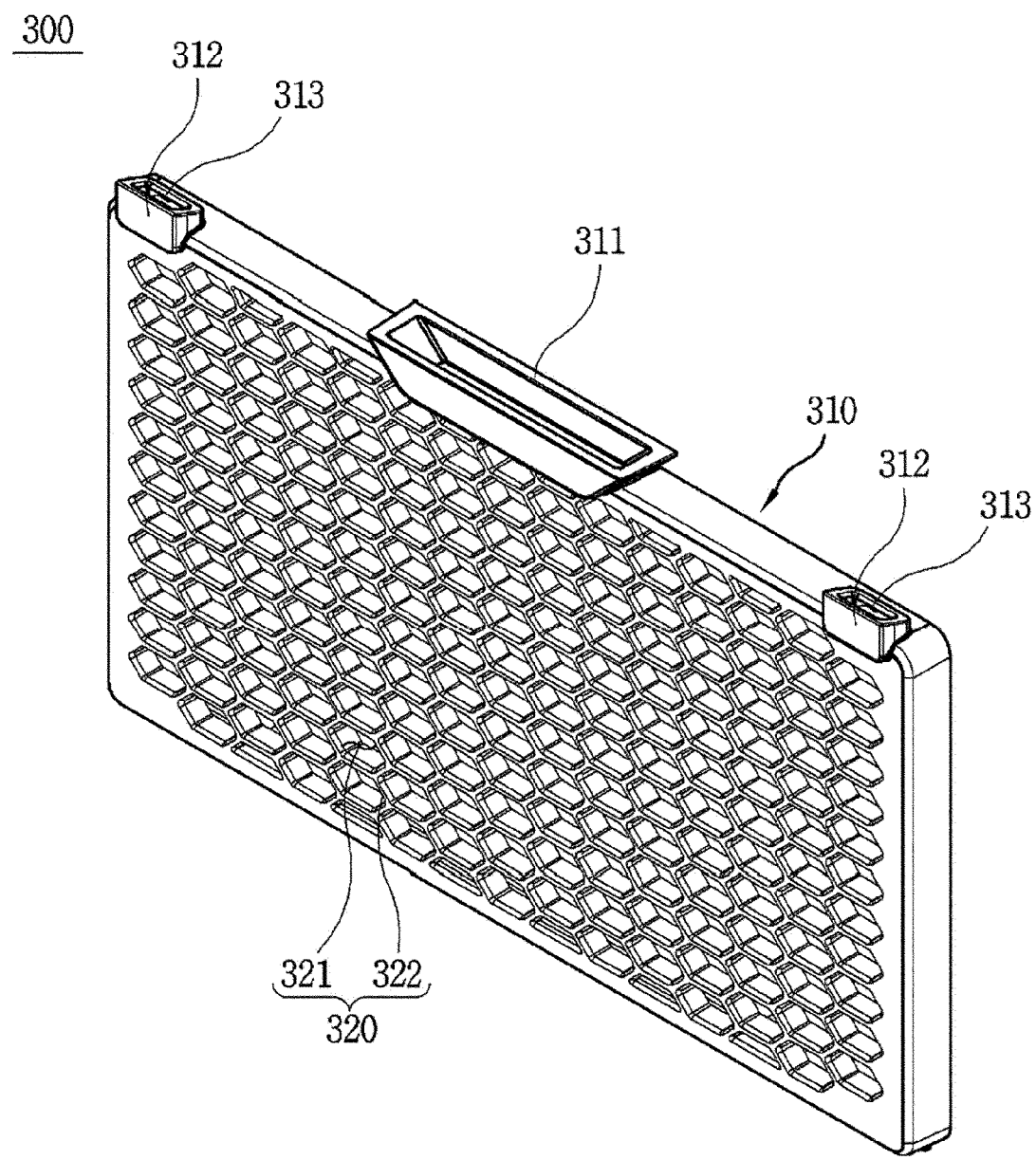
FIG. 17 is a perspective view illustrating a filter cover provided in the cover assembly of FIG. 3.
Figure 18:
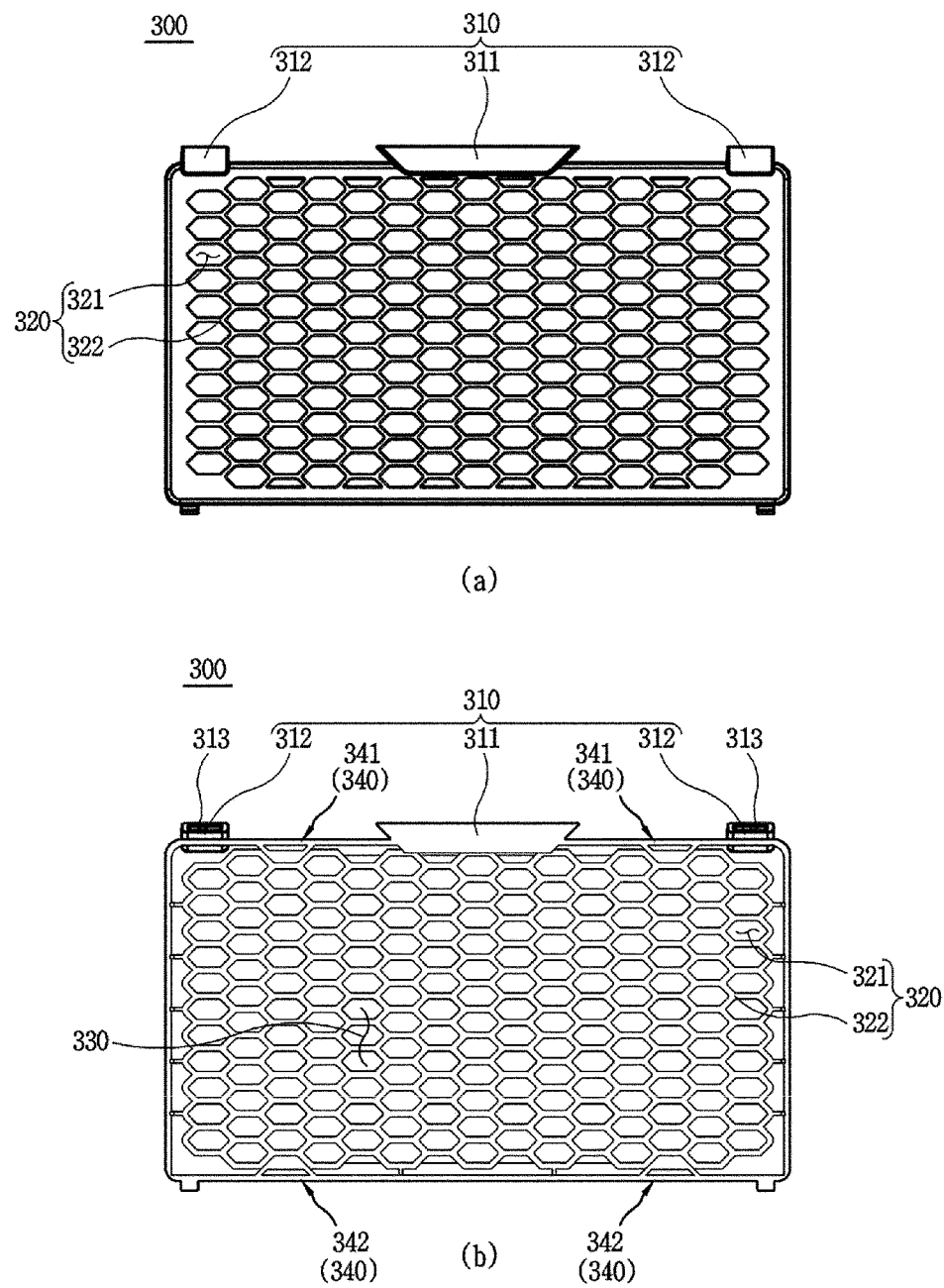
FIG. 18 is a front view (a) and a rear view (b) illustrating the filter cover of FIG. 17.
Figure 20:
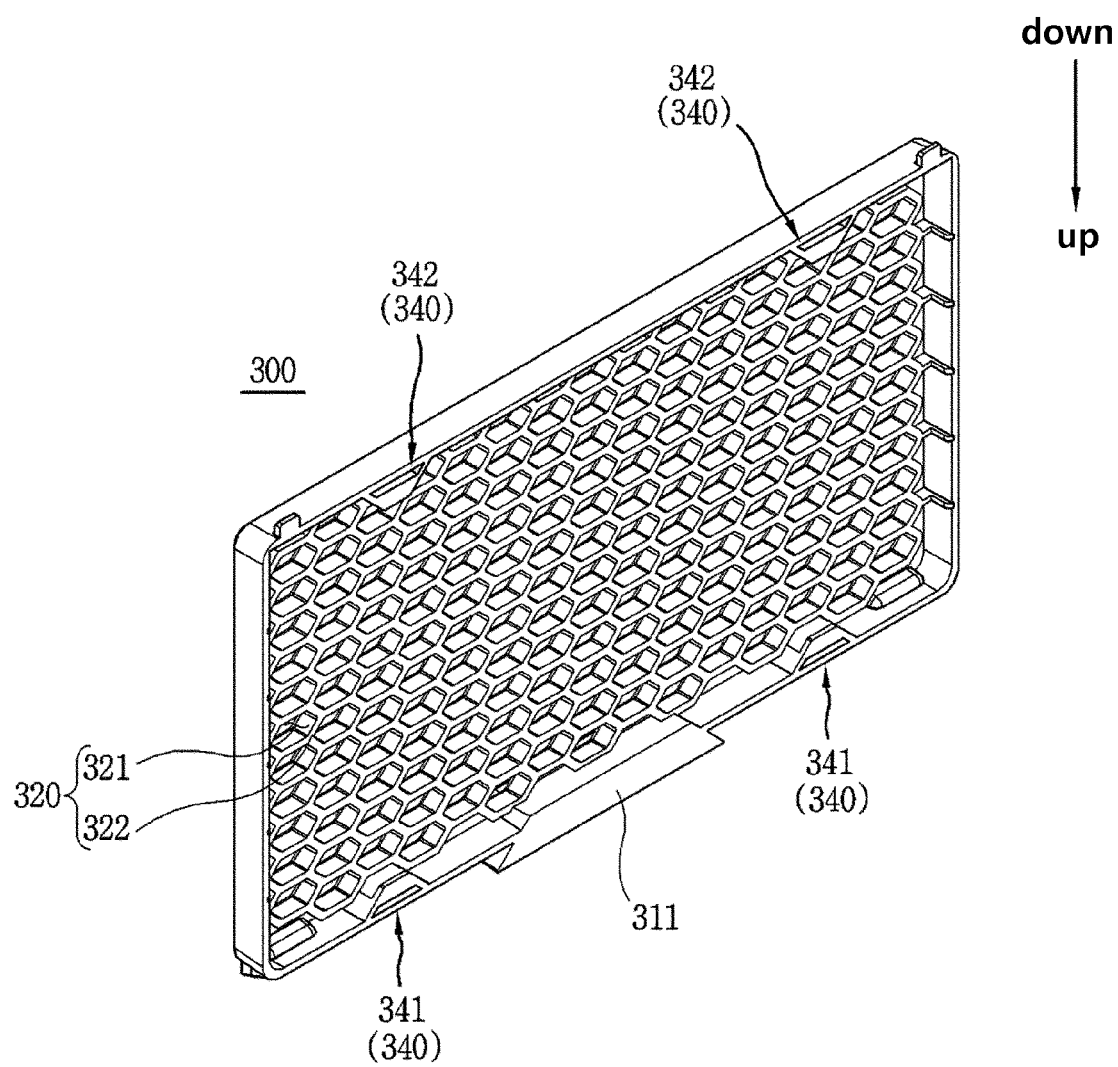
FIG. 20 is a perspective view from yet another angle, illustrating the filter cover of FIG. 17.

Referring to FIGS. 17 and 20, the cover assembly 20 according to an embodiment of the present disclosure includes a filter cover 300.

The filter cover 300 supports the filter member 400 inserted into the main cover 100 from the outside. The filter cover 300 covers the filter member 400 and is detachably coupled to the main cover 100.

The filter cover 300 is inserted into the accommodation space part 130 of the main cover 100. Therefore, the shape of the filter cover 300 may be determined to correspond to the shape of the accommodation space part 130. In the illustrated embodiment, the filter cover 300 is provided in a rectangular plate shape having an extension length in the left-right direction longer than an extension length in the vertical direction and a thickness in the front-rear direction.

One surface of the surfaces of the filter cover 300, the front side surface in the illustrated embodiment, is exposed to the outside. The other surface of the surfaces of the filter cover 300 facing the one surface, the rear side surface in the illustrated embodiment, faces the filter member 400.

In the illustrated embodiment, the filter cover 300 includes a filter cover body 310, a grid part 320, a filter accommodating part 330 and a filter support part 340.

The filter cover body 310 forms the exterior or body of the filter cover 300. Each component of the filter cover body 310 described above, that is, the grid part 320, the filter accommodating part 330, and the filter support part 340 are located in the filter cover body 310.

The filter cover body 310 may be formed of a lightweight yet highly rigid material. This is to prevent an excessive increase in the total weight of the power conversion device 1 provided with the cover assembly 20.

The filter cover body 310 may be formed of a heat-resistant material. This is to prevent damage caused by heat generated from the inverter device 10.

In an embodiment, the filter cover body 310 may be formed of a synthetic resin material such as reinforced plastic or a ceramic material.

In the illustrated embodiment, the filter cover body 310 includes a gripping part 311, a restraining protrusion part 312, and a fastening space part 313.

The gripping part 311 is a part where the filter cover body 310 is gripped by an operator. When the filter cover 300 is coupled to the main cover 100, the gripping part 311 is exposed to one side of the accommodation space part 130. In the illustrated embodiment, the gripping part 311 is exposed on the upper side of the accommodation space part 130.

The gripping part 311 is positioned adjacent to the gripping space part 213. In an embodiment, the gripping part 311 may be partially accommodated in the gripping space part 213. After inserting a hand or a tool into the gripping space part 213, the operator may grip the gripping part 311.

The gripping part 311 is located at one edge of the filter cover body 310. In the illustrated embodiment, the gripping part 311 is located at one side, that is, at an upper edge, of the filter cover body 310 facing the sub cover 200.

In an embodiment, the gripping part 311 may be located at a central portion in a direction in which the filter cover body 310 extends long, that is, in the left-right direction in the illustrated embodiment. The position of the gripping part 311 may be changed according to the position of the gripping space part 213.

An opening (reference numeral not indicated) may be formed inside the gripping part 311. An operator may grip one or more of a plurality of surfaces surrounding the opening.

The restraining protrusion part 312 is positioned spaced apart from the gripping part 311.

The restraining protrusion part 312 is a part where the filter cover 300 is coupled to the main cover 100. The restraining protrusion part 312 is coupled to or separated from the coupling extension part 143 of the main cover 100. Accordingly, any separation of the filter cover 300 inserted into the accommodation space part 130 and the filter member 400 supported by the filter cover 300 can be prevented.

The restraining protrusion part 312 is located at the one edge of the filter cover body 310. That is, the restraining protrusion part 312 is located at the one side, that is, at an upper edge, of the filter cover body 310 facing the sub cover 200.

The restraining protrusion part 312 is positioned to be spaced apart from the gripping part 311. In addition, the restraining protrusion part 312 may be disposed to overlap the fastening part 140 in the vertical direction. Specifically, the restraining protrusion part 312 may be positioned vertically below the coupling extension part 143 of the fastening part 140.

A plurality of restraining protrusion parts 312 may be provided. The plurality of restraining protrusion parts 312 may be positioned to be spaced apart from each other.

In the illustrated embodiment, two restraining protrusion parts 312 are provided, and are spaced apart from each other in a direction in which the filter cover body 310 extends long, that is, in the left-right direction. The gripping part 311 is positioned between the two restraining protrusion parts 312.

In other words, the two restraining protrusion parts 312 are disposed to be spaced apart from each other and face each other with the gripping part 311 interposed therebetween.

One end of the restraining protrusion part 312 facing the fastening part 140, the upper end in the illustrated embodiment, is formed to be inclined downward toward the filter cover body 310. In other words, the height of the front side of the upper end of the restraining protrusion part 312 is higher than the height of the rear side.

Therefore, the filter cover body 310 may be easily inserted into the accommodation space part 130, and may not be arbitrarily separated.

The restraining protrusion part 312 may include a plurality of surfaces. In the illustrated embodiment, restraining protrusion part 312 includes two pairs of surfaces facing each other. Each pair of surfaces is continuous with each other, and the fastening space part 313 is formed therebetween.

The fastening space part 313 is a space into or out of which the coupling extension part 143 of the fastening part 140 is inserted and drawn. The fastening space part 313 is formed inside the restraining protrusion part 312.

Specifically, as described above, the restraining protrusion part 312 is composed of two pairs of surfaces facing each other. The fastening space part 313 may be defined as a space in which each pair of surfaces are formed to be spaced apart from each other.

In other words, each pair of surfaces constituting the restraining protrusion part 312 are disposed to face each other with the fastening space part 313 interposed therebetween.

An opening is formed on one side of the fastening space part 313 facing the sub cover 200, that is, on the upper side in the illustrated embodiment. The coupling extension part 143 of the fastening part 140 may be inserted into or drawn out of the fastening space part 313 through the opening.

A lower end of the coupling extension part 143 inserted into the fastening space part 313 may be supported by one or more of a plurality of surfaces surrounding the fastening space part 313.

Accordingly, the filter cover 300 and the filter member 400 accommodated in the accommodation space part 130 may be maintained in a coupled state without being arbitrarily separated.

The grid part 320 is a part where the filter cover 300 communicates with the outside. Outside air may pass through the grid part 320 and flow toward the filter member 400.

The grid part 320 is formed on one surface of the filter cover body 310 opposite to the filter member 400, that is, on the front side surface in the illustrated embodiment. That is, the grid part 320 is disposed to face the blower fan 11 or the communication part 120 with the filter member 400 interposed therebetween.

In the illustrated embodiment, the grid part 320 includes a through hole 321 and a rib 322.

The through hole 321 functions as a passage through which outside air passes through the filter cover 300. The through hole 321 is formed on the one surface of the filter cover body 310, that is, on the front side in the illustrated embodiment.

The through hole 321 is formed through the thickness direction of the one surface of the filter cover body 310, that is, in the forward and backward directions in the illustrated embodiment. In other words, the through hole 321 is formed through in a direction toward the filter member 400.

In the illustrated embodiment, the through hole 321 is formed to have a hexagonal cross-section. The shape of the through hole 321 may be changed to other polygonal, circular, or elliptical shapes.

A plurality of through holes 321 may be formed. The plurality of through holes 321 may be positioned to be spaced apart from each other. That is, the plurality of through holes 321 are spaced apart by ribs 322.

The rib 322 is formed between the plurality of through holes 321 to physically space the plurality of through holes 321 apart. In addition, the rib 322 reinforces the rigidity of the one surface of the filter cover body 310 on which the through hole 321 is formed.

A plurality of ribs 322 may be formed. The plurality of ribs 322 may be respectively positioned between the plurality of through holes 321.

Figure 19:
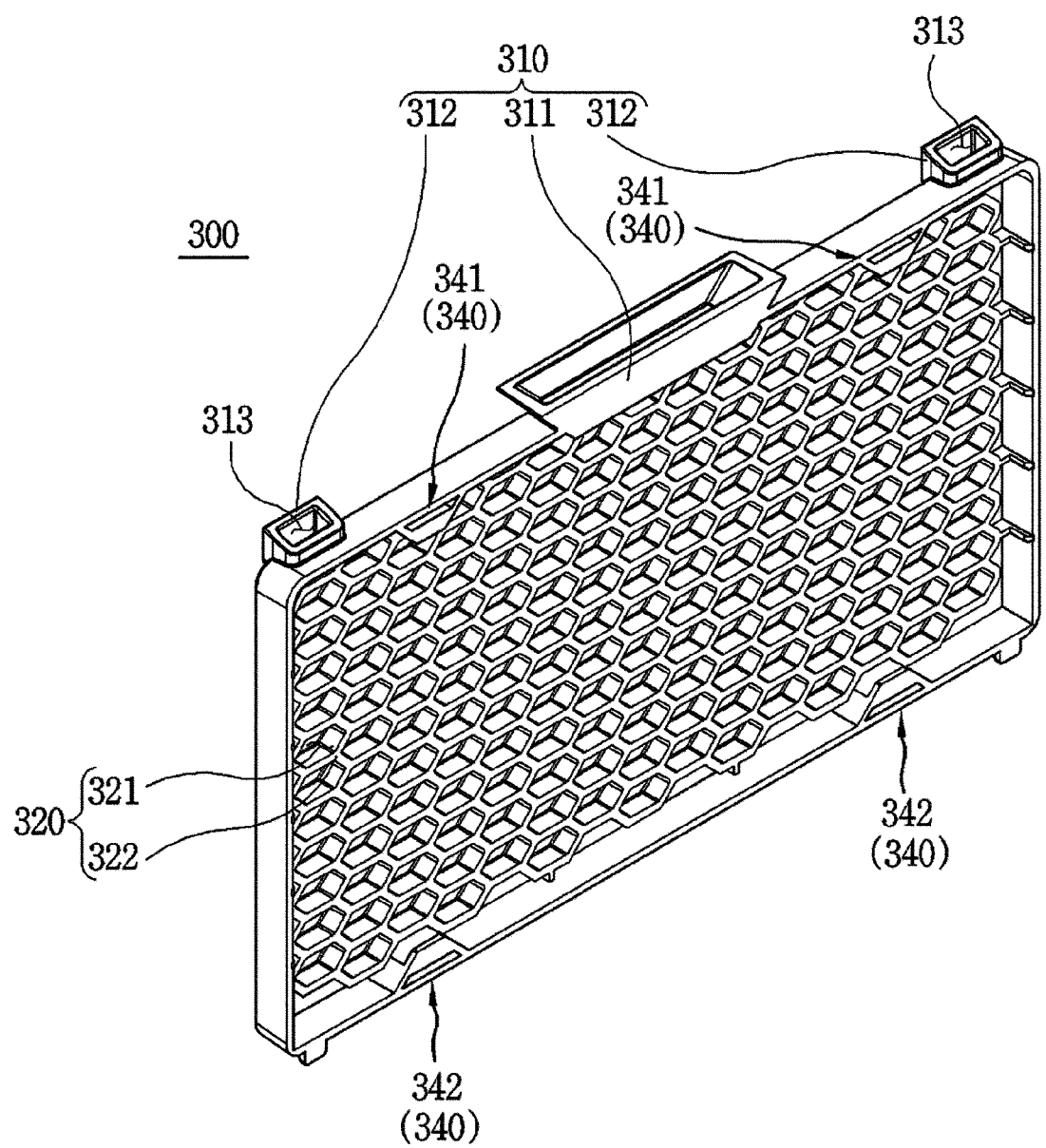
FIG. 19 is a perspective view from another angle, illustrating the filter cover of FIG. 17.

The filter accommodating part 330 is a space accommodating the filter member 400 (best shown in FIGS. 19 and 20). The filter accommodating part 330 is formed partially open, and the remaining portion is formed surrounded by the filter cover body 310.

The filter accommodating part 330 is formed on the other side of the filter cover body 310 facing the main cover 100 or the filter member 400, that is, on the rear side in the illustrated embodiment.

One side of the filter accommodating part 330, the front side in the illustrated embodiment, is surrounded by the grid part 320. The filter accommodating part 330 communicates with the outside through the through hole 321 of the grid part 320.

The other side opposite to the one side of the filter accommodating part 330, the rear side in the illustrated embodiment, is formed open. The filter member 400 may be accommodated in the filter accommodating part 330 through the rear side.

The other sides of the filter accommodating part 330, that is, the upper, lower, left and right sides in the illustrated embodiment are surrounded by the filter cover body 310, respectively. The filter cover body 310 may support the filter member 400 accommodated in the filter accommodating part 330 from each side.

The filter support part 340 is positioned inside one or more of the other sides of the filter cover body 310 surrounding the filter accommodating part 330.

The filter support part 340 supports the filter member 400 accommodated in the filter accommodating part 330. Due to the filter support part 340, the filter member 400 is prevented from swinging while being accommodated in the filter accommodating part 330.

The filter support part 340 is coupled to the filter cover body 310. Specifically, as described above, the filter accommodating part 330 is surrounded by the filter cover body 310 on its upper, lower, left and right sides.

The filter support part 340 may be provided inside one or more of the upper, lower, left, and right sides of the filter cover body 310. In the illustrated embodiment, the filter support part 340 is located inside the upper and lower sides of the filter cover body 310.

The filter support part 340 may include a plurality of surfaces spaced apart from each other and facing each other. A space into which the filter member 400 is inserted is formed between the plurality of surfaces.

In the illustrated embodiment, the filter support part 340 includes one surface positioned adjacent to the rear side end and the other surface positioned between the one surface and the grid part 320 and facing the one surface with the space interposed therebetween.

As described above, a plurality of filter support parts 340 may be provided. The plurality of filter support parts 340 may support the filter member 400 at different positions.

In the illustrated embodiment, the filter support part 340 includes a first filter support part 341 located inside the upper side of the filter cover body 310 and a second filter support part 342 located inside the lower side of the filter cover body 310.

Each of the first filter support part 341 and the second filter support part 342 may be provided in a plurality. The plurality of first filter support parts 341 may be spaced apart from each other. The plurality of second filter support parts 342 may also be spaced apart from each other.

In the illustrated embodiment, two first filter support parts 341 and two second filter support parts 342 are provided, and are spaced apart from each other in a direction in which the filter cover body 310 extends longer, that is, in the left and right directions in the illustrated embodiment.

Therefore, the filter member 400 accommodated in the filter accommodating part 330 is supported at a plurality of locations, that is, the upper left side, the upper right side, the lower left side, and the lower right side. Accordingly, the filter member 400 can be stably accommodated in the filter accommodating part 330.

(4) Description of the Filter Member 400

Referring back to FIG. 9, the cover assembly 20 according to an embodiment of the present disclosure includes a filter member 400.

The filter member 400 filters outside air flowing into the inverter device 10. Dust or the like contained in the outside air is filtered out by the filter member 400. That is, the outside air passing through the filter member 400 is in a state in which dust is removed.

Therefore, each component provided inside the inverter device 10 is not damaged by the introduced outside air.

The filter member 400 may be provided in any form capable of filtering out dust or the like contained in the air while allowing air to pass therethrough. In an embodiment, it may be provided as a pre filter, a medium filter, a high efficiency particulate air filter (HEPA) or an ultra low penetration air filter (ULPA), or the like.

In the illustrated embodiment, the filter member 400 has a rectangular cross-section and is provided in a rectangular plate shape having a thickness in the front-rear direction. The shape of the filter member 400 may be changed according to the shapes of the main cover 100 and the filter cover 300.

The filter member 400 is accommodated in the main cover 100. Specifically, the filter member 400 is accommodated in the accommodation space part 130 formed inside the main cover 100.

One side of the filter member 400 facing the main cover 100, that is, the rear side in the illustrated embodiment, may be supported by the main cover 100. The other side of the filter member 400 opposite to the main cover 100, that is, the front side in the illustrated embodiment, may be supported by the filter cover 300.

That is, the filter cover 300 is disposed to face the accommodation space part 130 of the main cover 100 with the filter member 400 interposed therebetween.

Meanwhile, as described above, the filter cover 300 is provided with a grid part 320 communicating with the outside. It will be understood that outside air may be introduced into the inverter device 10 by sequentially passing through the through hole 321 of the grid part 320 and the filter member 400.

4. Description of the Coupling Relationship Constituting the Cover Assembly 20 According to an Embodiment of the Present Disclosure The cover assembly 20 according to an embodiment of the present disclosure is coupled to the inverter device 10 to physically separate the inverter device 10 from the outside. In addition, the cover assembly 20 may inhale outside air for cooling the heat generated inside the inverter device 10, but may filter dust or the like contained in the outside air.

Therefore, since the blower fan 11 provided in the inverter device 10 is not exposed to the outside, safety accidents that may occur due to the operation of the blower fan 11 can be prevented. In addition, since each component of the inverter device 10 is covered by the cover assembly 20, it is not exposed to the outside.

Furthermore, since outside air is filtered and then introduced into the inverter device 10, components inside the inverter device 10 are not damaged by dust or the like. Furthermore, the appearance of the inverter device 10 and the power conversion device 1 including the same may be more beautiful by the cover assembly 20.

Each component of the above-described cover assembly 20 may be maintained in a coupled state by various methods. That is, unless an external force is applied, each component constituting the cover assembly 20 is not separated arbitrarily.

Hereinafter, the coupling relationship of each component of the cover assembly according to an embodiment of the present disclosure will be described in detail with reference to FIGS. 21 to 24.

Figure 21:
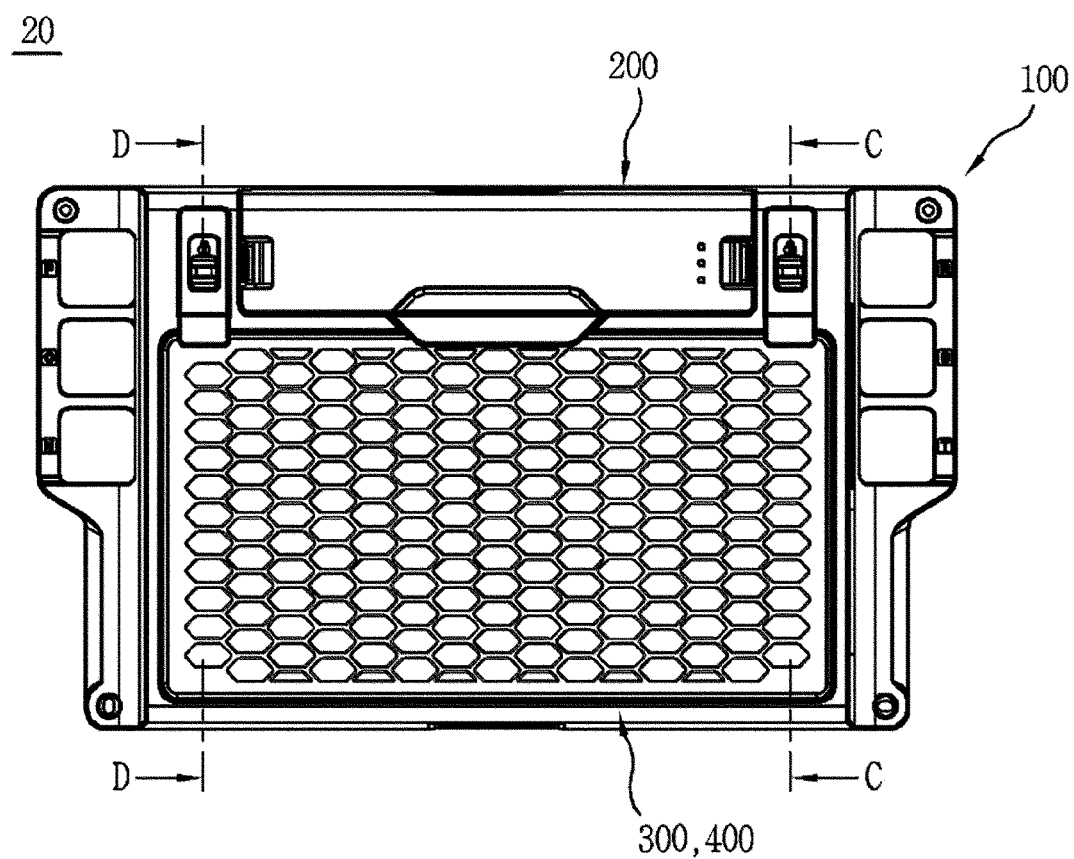
FIG. 21 is a front view illustrating a state in which a cover assembly is coupled to an inverter device, according to an exemplary embodiment of the present disclosure.

Referring to FIGS. 21 and 22, a front view (FIG. 21) and a side cross-sectional view (FIG. 22) of a state in which each component constituting the cover assembly 20 is coupled to each other are shown.

In the coupled state, the handle part 141 of the fastening part 140 of the main cover 100 is moved by sliding in a direction toward the filter cover 300, that is, downward. Accordingly, the coupling extension part 143 is also moved downward and inserted into the fastening space part 313 of the filter cover 300.

The coupling extension part 143 inserted into the fastening space part 313 is supported by any one or more of the plurality of surfaces surrounding the fastening space part 313, that is, the two pairs of surfaces forming the restraining protrusion part 312.

Meanwhile, the filter accommodating part 330 of the filter cover 300 is formed in a shape corresponding to the shape of the filter member 400. In addition, the filter cover 300 is formed in a shape corresponding to the shape of the accommodation space part 130.

Therefore, when the filter cover 300 to which the filter member 400 is coupled is accommodated in the accommodation space part 130, the filter cover 300 is supported by the fastening part 140 so that it does not swing.

Meanwhile, the sub cover 200 is also coupled to the main cover 100. In this case, the sub cover 200 and the main cover 100 are coupled in a direction in which the guide bar 230 of the sub cover 200 is inserted into the hollow part formed inside the guide extension part 151 of the main cover 100.

In this case, the pressing protrusion 222 of the sub coupling part 220 is pressed inward by an external force. Accordingly, the shape of the elastic part 223 is deformed, and the sub protrusion 221 connected to the elastic part 223 is also moved inward, so that it does not overlap with the coupling protrusion 152 in the front-rear direction.

When the coupling between the guide bar 230 and the guide extension part 151 is completed, the coupling protrusion 152 is positioned between the sub protrusion 221 and the pressing protrusion 222 in the front-rear direction. When the external force applied to the pressing protrusion 222 is released, the elastic part 223 is deformed in shape and returns to its original shape by the stored restoring force.

Accordingly, the sub protrusion 221 and the pressing protrusion 222 are moved outward, so that the coupling protrusion 152 is accommodated in a space formed between the sub protrusion 221 and the pressing protrusion 222.

The coupling protrusion 152 is disposed to overlap the sub protrusion 221 in the front-rear direction on the front side of the sub protrusion 221, so that the sub cover 200 is not separated from the main cover 100 unless an external force is applied.

Figure 23:
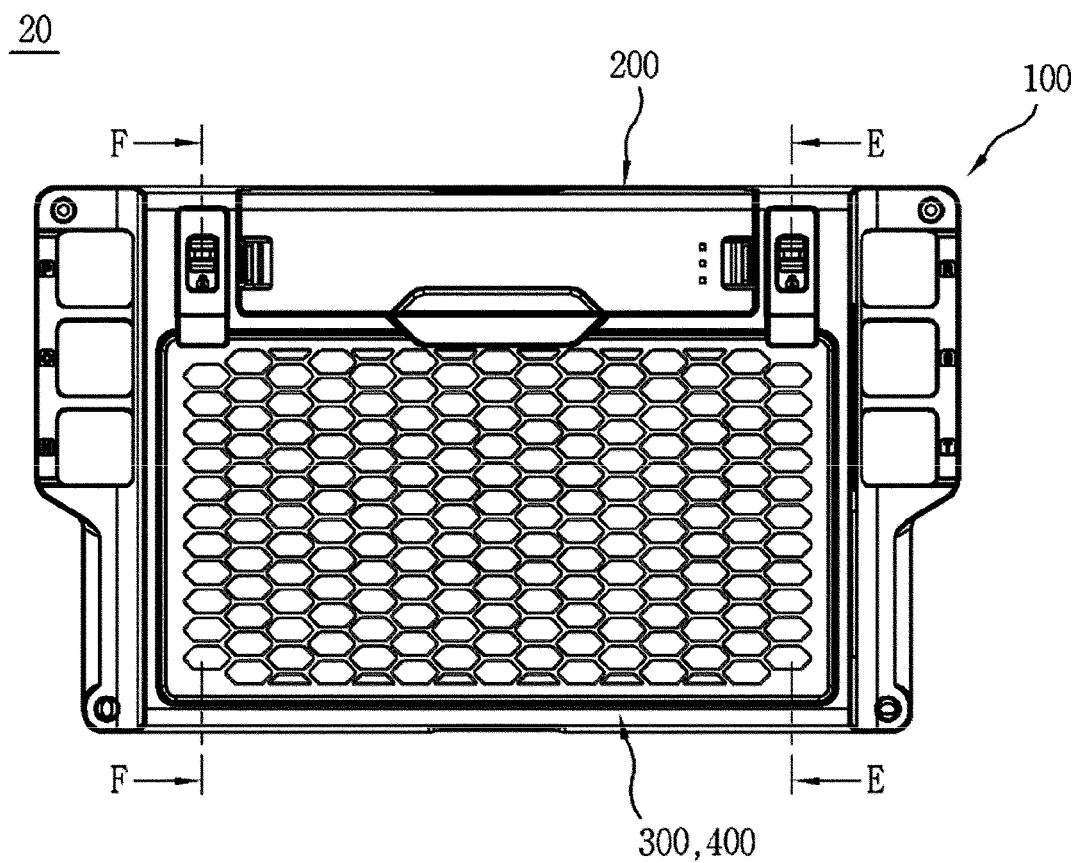
FIG. 23 is a front view illustrating a state in which a cover assembly can be separated from an inverter device, according to an exemplary embodiment of the present disclosure.

Referring to FIGS. 23 and 24, a front view (FIG. 23) and a side cross-sectional view (FIG. 24) of a state in which each component constituting the cover assembly 20 can be separated are shown.

In the above state, the handle part 141 of the fastening part 140 is moved by sliding in a direction opposite to the filter cover 300, that is, upward. Accordingly, the coupling extension part 143 is also moved upward and drawn out of the fastening space part 313.

Therefore, the fastening part 140 does not restrain the filter cover 300, so the filter cover 300 can be drawn out of the accommodation space part 130.

In addition, in order to separate the sub cover 200 from the main cover 100, the pressing protrusion 222 is pressed inward. Accordingly, the shape of the elastic part 223 is deformed, and the sub protrusion 221 connected to the elastic part 223 is also moved inward, so that it does not overlap with the coupling protrusion 152 in the front-rear direction.

Accordingly, the sub cover 200 may be moved in a direction opposite to the main cover 100, that is, toward the front side in the illustrated embodiment.

In this case, the guide bar 230 is drawn out of the guide extension part 151. As described above, in an embodiment in which a plurality of guide bars 230 are provided, the guide bars 230 are drawn out of the guide extension part 151 at the same speed. That is, by the guide bar 230 and the guide extension part 151, the withdrawal direction of the sub cover 200 may be guided in the horizontal direction and the vertical direction.

Thus, the sub cover 200 can be easily and stably separated from the main cover 100.

Although the above has been described with reference to preferred embodiments of the present disclosure, it will be understood that those skilled in the art can variously modify and change the present disclosure without departing from the idea and scope of the present disclosure described in the claims below.

| Description of Symbols | |
|---|---|
| 1: power conversion device | 10: inverter device |
| 11: blower fan | 12: terminal unit |
| 20: cover assembly | 100: main cover |
| 110: main body | 111: wing part |
| 112: terminal opening | 120: communication part |
| 121: partition wall | 130: accommodation space part |
| 140: fastening part | 141: handle part |
| 143: coupling extension part | 144: support member |
| 150: main coupling part | 151: guide extension part |
| 152: coupling protrusion | 200: sub cover |
| 210: sub body | 211: first sub surface |
| 212: second sub surface | 213: gripping space part |
| 220: sub coupling part | 221: sub protrusion |
| 222: pressing protrusion | 223: elastic part |
| 230: guide bar | 300: filter cover |
| 310: filter cover body | 311: gripping part |
| 312: restraining protrusion part | 313: fastening space part |
| 320: grid part | 321: through hole |
| 322: rib | 330: filter accommodating part |
| 340: filter support part | 341: first filter support part |
| 342: second filter support part | 400: filter member |

What is claimed is:

1. A cover assembly, comprising:

a main cover with a space formed therein;
a filter cover that covers the space of the main cover and is detachably coupled to the main cover; and
a filter member detachably coupled to the filter cover and accommodated in the space of the main cover,
wherein the main cover comprises: an accommodation space part formed through and communicating with the outside and forming the space; and a main body partially surrounding the accommodation space part, and the filter cover accommodated in the accommodation space part is supported by the main body,
wherein the main cover comprises a fastening part provided to be movable in a direction toward the filter cover and in a direction opposite to the filter cover, and
wherein the filter cover comprises a fastening space part located on one side facing the fastening part and into or out of which the fastening part is accommodated or drawn, and
wherein the fastening part comprises:
  a handle part extending to be exposed to the outside of the main cover and coupled to the main body to be movable in a direction toward the filter cover and in a direction opposite to the filter cover; and
  a coupling extension part coupled to the handle part to be movable together with the handle part, extending toward the filter cover, and accommodated in or drawn out of the fastening space part.

2. The cover assembly of claim 1, further comprising:
a sub cover that is detachably coupled to the main cover and extends in one direction,
wherein the main cover has coupling protrusions located on each part of the main body surrounding each end of the sub cover in the one direction, and protruding toward the sub cover, and
wherein the sub cover comprises a sub coupling part detachably coupled to the coupling protrusion.

3. The cover assembly of claim 2, wherein the sub coupling part comprises:
a sub protrusion that protrudes toward said each part of the main body and is in contact with or spaced apart from the coupling protrusion; and
a pressing protrusion that protrudes toward said each part of the main body and is spaced apart from the sub protrusion to form a space therebetween, and
the coupling protrusion is inserted into or drawn out of the space formed between the sub protrusion and the pressing protrusion.

4. The cover assembly of claim 3, wherein the sub coupling part comprises an elastic part formed of a shape-deformable material that is continuous with the sub protrusion and the pressing protrusion, respectively.

5. The cover assembly of claim 4, wherein the pressing protrusion is located farther from the main body than the sub protrusion.

6. The cover assembly of claim 4,
wherein the sub cover is moved in the other direction and coupled to the main cover, and
when the pressing protrusion is pressed in a direction opposite to the coupling protrusion, the coupling protrusion and the sub protrusion are positioned to overlap each other along the other direction.

7. The cover assembly of claim 1,
wherein the filter cover comprises a restraining protrusion part that surrounds the fastening space part and extends toward the fastening part,
the restraining protrusion part comprises:
  any pair of surfaces disposed to face each other with the fastening space part interposed therebetween; and
  another pair of surfaces that are continuous with said any pair of surfaces and face each other with the fastening space part interposed therebetween, and
the fastening part accommodated in the fastening space part is supported by any one or more of said any pair of surfaces and said another pair of surfaces.

8. The cover assembly of claim 1, wherein the filter cover comprises:
a filter accommodating part accommodating the filter member and having one side facing the main cover open; and
a filter cover body partially surrounding the filter accommodating part.

9. The cover assembly of claim 8, wherein the filter cover comprises a grid part located on the other side opposite to the one side and including a plurality of through holes communicating with the outside of the filter accommodating part.

10. The cover assembly of claim 8,
wherein the filter cover comprises a filter support part positioned on the filter cover body partially surrounding the filter accommodating part to support the filter member accommodated therein, and
the filter support part comprises:
a plurality of surfaces extending toward the filter accommodating part and spaced apart from each other and disposed to face each other; and
a space formed between the plurality of surfaces and into which the filter member is inserted.

11. A power conversion device, comprising:
an inverter device electrically connected to an external power source and comprising a blower fan operated by the external power source; and a cover assembly that covers the blower fan and is detachably coupled to the inverter device,
wherein the cover assembly comprises:
a main cover accommodating the blower fan and comprising a communication part communicating with the outside;
a filter cover detachably coupled to the main cover and covering the communication part; and
a filter member accommodated in the filter cover and covering the communication part,
wherein the main cover comprises a fastening part provided to be movable in a direction toward the filter cover and in a direction opposite to the filter cover, and
the filter cover comprises a fastening space part located on one side facing the fastening part and into or out of which the fastening part is accommodated or drawn,
wherein the fastening part comprises:
  a handle part extending in a direction opposite to the inverter device, exposed to the outside of the main cover, and coupled to the main cover to be liftable or lowered; and
  a coupling extension part connected to the handle part to be lifted or lowered together with the handle part, and inserted into or drawn out of the fastening space part.

12. The power conversion device of claim 11,
wherein the main cover comprises an accommodation space part communicating with the outside and the communication part, formed on one side opposite to the inverter device, and accommodating the filter cover, and the filter cover comprises a grid part positioned to face the communication part with the filter member interposed therebetween, and having a plurality of through holes and a plurality of ribs surrounding the through holes.

13. The power conversion device of claim 12, further comprising a sub cover detachably coupled to the main cover, wherein the main cover comprises:

a main coupling part that communicates with the accommodation space part and is a space covered by the sub cover; and a coupling protrusion protruding toward the main coupling part from a surface surrounding the main coupling part, and the sub cover comprises a sub coupling part comprising a space into or out of which the coupling protrusion is accommodated or drawn.

14. The power conversion device of claim 13, wherein the sub coupling part comprises:

a sub protrusion protruding toward the surface and positioned closer to the main cover than the coupling protrusion in a state where the coupling protrusion is accommodated;

a pressing protrusion protruding toward the surface and located to face the sub protrusion with the coupling protrusion interposed therebetween in a state where the coupling protrusion is accommodated; and an elastic part formed of a shape-deformable material that is continuous with the sub protrusion and the pressing protrusion.

15. The power conversion device of claim 14, wherein when the pressing protrusion is pressed toward the main coupling part, the sub protrusion is moved in a direction opposite to the coupling protrusion and is spaced apart from the coupling protrusion.

* * * * *